(12) United States Patent
Rölle et al.

(10) Patent No.: US 8,999,608 B2
(45) Date of Patent: *Apr. 7, 2015

(54) FLUOROURETHANE AS AN ADDITIVE IN A PHOTOPOLYMER FORMULATION

(75) Inventors: Thomas Rölle, Leverkusen (DE); Friedrich-Karl Bruder, Krefeld (DE); Thomas Fäcke, Leverkusen (DE); Marc-Stephan Weiser, Leverkusen (DE); Dennis Honel, Zülpich-Wichterich (DE)

(73) Assignee: Bayer MaterialScience AG, Leverkusen (DE)

( * ) Notice: Subject to any disclaimer, the term of this patent is extended or adjusted under 35 U.S.C. 154(b) by 172 days.

This patent is subject to a terminal disclaimer.

(21) Appl. No.: 13/504,357

(22) PCT Filed: Nov. 2, 2010

(86) PCT No.: PCT/EP2010/066591
§ 371 (c)(1),
(2), (4) Date: May 18, 2012

(87) PCT Pub. No.: WO2011/054795
PCT Pub. Date: May 12, 2011

(65) Prior Publication Data
US 2012/0231376 A1 Sep. 13, 2012

(30) Foreign Application Priority Data
Nov. 3, 2009 (EP) .................................... 09013770

(51) Int. Cl.
*G03H 1/02* (2006.01)
*G11B 7/245* (2006.01)
(Continued)

(52) U.S. Cl.
CPC .......... *G11B 7/245* (2013.01); *C08G 18/2885* (2013.01); *C08G 18/4277* (2013.01);
(Continued)

(58) Field of Classification Search
CPC ........... C08G 18/2885; C08G 18/4277; C08G 18/4854; C08G 18/4887; C08G 18/71; C08G 18/715; C08G 18/73; C08G 18/755; C08G 18/758; C08G 18/776; C08G 18/792; C08G 18/8175; G03F 7/001; G03F 7/0046; G03F 7/035; G03H 1/02; G11B 7/24044; G11B 7/245

See application file for complete search history.

(56) References Cited

U.S. PATENT DOCUMENTS 3,376,266 A * 4/1968 Hoegger et al. ................ 528/75
3,872,058 A * 3/1975 Gresham ......................... 528/70
(Continued)

FOREIGN PATENT DOCUMENTS

| JP | 57-131753 | * 8/1982 |
| JP | 2003-302726 | * 10/2003 |

(Continued)

OTHER PUBLICATIONS

International Search Report for PCT/EP2010/066591 mailed Dec. 23, 2010.

*Primary Examiner* — Martin Angebranndt
(74) *Attorney, Agent, or Firm* — Drinker Biddle & Reath LLP

(57) ABSTRACT

The invention relates to a photopolymer formulation comprising matrix polymers, writing monomers, and photoinitiators, to the use of the photopolymer formulation for producing optical elements, in particular for producing holographic elements and images, to a method for illuminating holographic media made of the photopolymer formulation, and to special fluorourethanes.

13 Claims, 1 Drawing Sheet

(51) Int. Cl.
  *C08G 18/28* (2006.01)
  *C08G 18/42* (2006.01)
  *C08G 18/48* (2006.01)
  *C08G 18/71* (2006.01)
  *C08G 18/73* (2006.01)
  *C08G 18/75* (2006.01)
  *C08G 18/77* (2006.01)
  *C08G 18/79* (2006.01)
  *C08G 18/81* (2006.01)
  *G03F 7/00* (2006.01)
  *G03F 7/004* (2006.01)
  *G11B 7/24044* (2013.01)
  *G03F 7/035* (2006.01)

(52) U.S. Cl.
  CPC ........ *C08G18/4854* (2013.01); *C08G 18/4887* (2013.01); *C08G 18/71* (2013.01); *C08G 18/715* (2013.01); *C08G 18/73* (2013.01); *C08G 18/755* (2013.01); *C08G 18/758* (2013.01); *C08G 18/776* (2013.01); *C08G 18/792* (2013.01); *C08G 18/8175* (2013.01); *G03F 7/001* (2013.01); *G03F 7/0046* (2013.01); *G03H 1/02* (2013.01); *G11B 7/24044* (2013.01); *G03F 7/035* (2013.01); *G03H 2001/0264* (2013.01); *G03H 2260/12* (2013.01)

(56) References Cited

U.S. PATENT DOCUMENTS

| | | | | |
|---|---|---|---|---|
| 4,046,944 A | * | 9/1977 | Mueller et al. | 442/94 |
| 4,085,092 A | * | 4/1978 | Chang et al. | 528/80 |
| 4,113,748 A | * | 9/1978 | Hager et al. | 549/556 |
| 4,534,770 A | * | 8/1985 | Kelly | 8/115.6 |
| 4,621,149 A | * | 11/1986 | Fukuoka et al. | 560/24 |
| 4,816,597 A | * | 3/1989 | Snyder et al. | 560/25 |
| 4,960,543 A | * | 10/1990 | Wehowsky et al. | 560/26 |
| 5,204,441 A | * | 4/1993 | Baum et al. | 528/70 |
| 5,672,651 A | * | 9/1997 | Smith | 524/590 |
| 5,747,629 A | * | 5/1998 | Yeske et al. | 528/70 |
| 7,288,213 B1 | * | 10/2007 | Charriere et al. | 252/182.2 |
| 2003/0087104 A1 | * | 5/2003 | Dhar et al. | 428/422.8 |
| 2003/0105263 A1 | | 6/2003 | Fan et al. | |
| 2006/0040185 A1 | * | 2/2006 | Takeyama | 430/1 |
| 2006/0223970 A1 | * | 10/2006 | Roesler et al. | 528/44 |
| 2008/0311483 A1 | * | 12/2008 | Stockel et al. | 430/2 |
| 2011/0236803 A1 | * | 9/2011 | Weiser et al. | 430/2 |
| 2012/0214089 A1 | * | 8/2012 | Honel et al. | 430/2 |
| 2012/0214090 A1 | * | 8/2012 | Weiser et al. | 430/2 |
| 2012/0214895 A1 | * | 8/2012 | Rolle et al. | 522/78 |
| 2012/0219883 A1 | * | 8/2012 | Bruder et al. | 430/2 |
| 2012/0219884 A1 | * | 8/2012 | Weiser et al. | 430/2 |
| 2012/0219885 A1 | * | 8/2012 | Facke et al. | 430/2 |
| 2012/0231377 A1 | * | 9/2012 | Weiser et al. | 430/2 |
| 2012/0237856 A1 | * | 9/2012 | Rolle et al. | 430/2 |
| 2012/0302659 A1 | * | 11/2012 | Rolle et al. | 522/173 |
| 2012/0321998 A1 | * | 12/2012 | Rolle et al. | 430/2 |
| 2013/0252140 A1 | * | 9/2013 | Facke et al. | 430/2 |

FOREIGN PATENT DOCUMENTS

| | | |
|---|---|---|
| KR | 100850022 B1 | 8/2008 |
| WO | WO-03/023519 A1 | 3/2003 |
| WO | WO-2008/125229 A1 | 10/2008 |

* cited by examiner

FLUOROURETHANE AS AN ADDITIVE IN A PHOTOPOLYMER FORMULATION

CROSS-REFERENCE TO RELATED APPLICATIONS

This application is a national stage application (under 35 U.S.C. §371) of PCT/EP2010/066591, filed Nov. 2, 2010, which claims benefit of European application 09013770.4, filed Nov. 3, 2009, both of which are incorporated herein by reference in their entirety for all their useful purposes.

BACKGROUND

The invention relates to a photopolymer formulation comprising matrix polymers, writing monomers and photoinitiators, the use of the photopolymer formulation for the production of optical elements, in particular for the production of holographic elements and images, a method for the exposure of holographic media comprising the photopolymer formulation and special fluorourethanes.

WO 2008/125229 A1 describes photopolymer formulations of the type mentioned at the outset. These comprise polyurethane-based matrix polymers, acrylate-based writing monomers and photoinitiators. In the cured state, the writing monomers and the photoinitiators are embedded with spatial distribution in the polyurethane matrix. It is also known from the WO document that dibutyl phthalate, a conventional plasticizer for industrial plastics, can be added to the photopolymer formulation.

For the uses of photopolymer formulations in the fields of use described below, the refractive index modulation $\Delta n$ produced by the holographic exposure in the photopolymer plays the decisive role. During the holographic exposure, the interference field of signal light beam and reference light beam (in the simplest case, that of two plane waves) is mapped into a refractive index grating by the local photopolymerization of, for example, highly refracting acrylates at sites of high intensity in the interference field. The refractive index grating in the photopolymer (the hologram) contains all information of the signal light beam. By illuminating the hologram only with the reference light beam, the signal can then be reconstructed. The strength of the signal thus reconstructed in relation to the strength of the incident reference light is referred to as diffraction efficiency, DE below. In the simplest case of a hologram which forms from the superposition of two plane waves, the DE is obtained from the quotient of the intensity of the light diffracted on reconstruction and the sum of the intensities of the incident reference light and diffracted light. The higher the DE, the more efficient is a hologram with respect to the necessary quantity of reference light which is required for making the signal visible with a fixed brightness. Highly refracting acrylates are capable of producing refractive index gratings having a high amplitude between regions having the lowest refractive index and regions having the highest refractive index and hence permitting holograms with high DE and high $\Delta n$ in photopolymer formulations. It should be noted that the DE is dependent on the product of $\Delta n$ and the photopolymer layer thickness d. The greater the product, the greater is the possible DE (for reflection holograms). The width of the angular range in which the hologram is visible (reconstructed), for example on monochromatic illumination, depends only on the layer thickness d. On illumination of the hologram with, for example, white light, the width of the spectral range which can contribute to the reconstruction of the hologram likewise depends only on the layer thickness d. The smaller d in this case, the greater are the respective acceptance widths. If it is therefore intended to produce bright and readily visible holograms, a high $\Delta n \cdot d$ and a small thickness d are desirable, in particular so that DE will be as large as possible. This means that the higher $\Delta n$, the more latitude is achieved for producing bright holograms by adaptation of d and without loss of DE. The optimization of $\Delta n$ is therefore of outstanding importance in the optimization of photopolymer formulations (P. Hariharan, Optical Holography, 2nd Edition, Cambridge University Press, 1996.).

BRIEF DESCRIPTION OF EMBODIMENTS

It was an object of the present invention to provide a photopolymer formulation which permits the production of holograms having greater brightness in comparison with the known formulations.

This object is achieved in the case of the photopolymer formulation according to the invention by virtue of the fact that it comprises fluorourethanes as plasticizers. Thus, it was found that the addition of fluorourethanes to the known photopolymer formulations leads to high $\Delta n$ values in the holograms produced therefrom. As result, this means that the holograms produced from the formulation according to the invention have a higher brightness compared with the known holograms.

BRIEF DESCRIPTION OF THE DRAWINGS

The foregoing brief description, as well as the following detailed description, may be better understood when read in conjunction with the appended drawings. For the purpose of assisting in the explanation of the invention, there are shown in the drawings representative embodiments which are considered illustrative. It should be understood, however, that the invention is not limited in any manner to the precise arrangements and instrumentalities shown.

In the drawings.

DETAILED DESCRIPTION OF EMBODIMENTS

Figure 1:
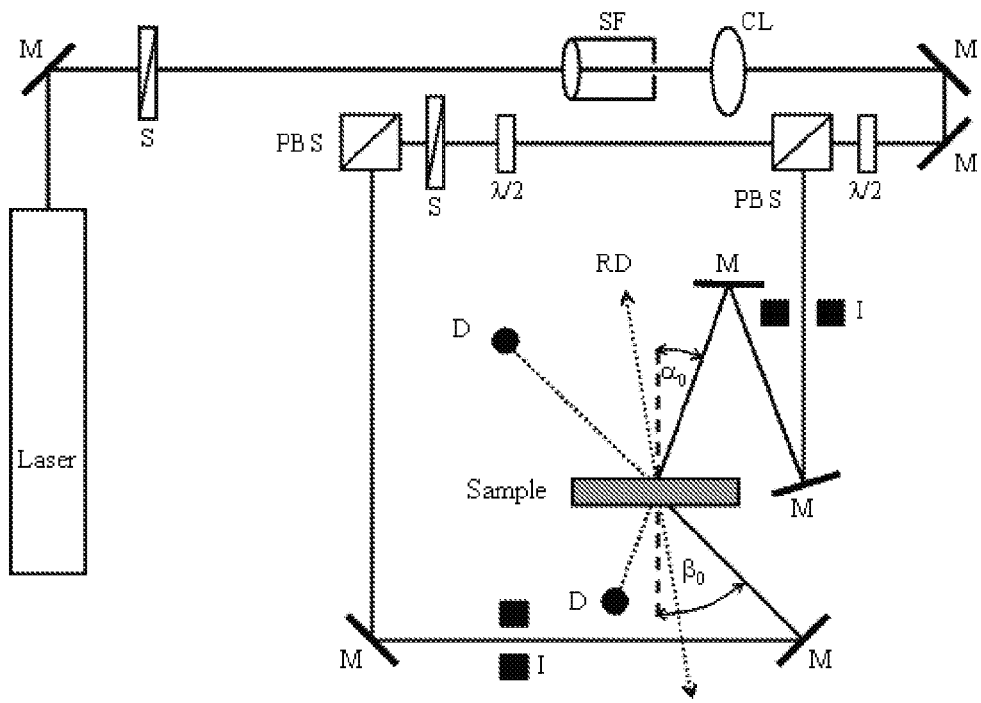
FIG. 1 illustrates an experimental holographic setup to measure the diffraction efficiency (DE) of the media.

The fluorourethanes are preferably compounds which have a structural element of the general formula (I)

(I)

and are substituted by at least one fluorine atom.

It is more preferable if the fluorourethanes have the general formula (II)

(II)

in which n is ≥1 and n is ≤8 and $R^1$, $R^2$, $R^3$ are hydrogen and/or, independently of one another, linear, branched, cyclic or heterocyclic organic radicals which are unsubstituted or optionally also substituted by heteroatoms, at least one of the radicals $R^1$, $R^2$, $R^3$ being substituted by at least one fluorine atom. It is particularly preferable here if $R^1$ is an organic radical having at least one fluorine atom.

According to a further embodiment, $R^1$ may comprise 1-20 $CF_2$ groups and/or one or more $CF_3$ groups, particularly preferably 1-15 $CF_2$ groups and/or one or more $CF_3$ groups, particularly preferably 1-10 $CF_2$ groups and/or one or more $CF_3$ groups, very particularly preferably 1-8 $CF_2$ groups and/or one or more $CF_3$ groups, $R^2$ may comprise a C1-C20 alkyl radical, preferably a C1-C15 alkyl radical, particularly preferably a C1-C10 alkyl radical, or hydrogen, and/or $R^3$ may comprise a C1-C20 alkyl radical, preferably a C1-C15 alkyl radical, particularly preferably a C1-C10 alkyl radical, or hydrogen.

It is particularly preferable if the fluorourethanes have uretdione, isocyanurate, biuret, allophanate, polyurea, oxadiazadione and/or iminooxadiazinedione structural elements and/or mixtures of these structural elements.

The fluorourethanes may have in particular a refractive index $n_D^{20}$ of ≤1.4600, preferably of ≤1.4500, particularly preferably of ≤1.4400 and especially preferably of ≤1.4300.

The fluorourethanes may have a fluorine content of 10-80% by weight of fluorine, preferably of 12.5-75% by weight of fluorine, particularly preferably of 15-70% by weight of fluorine and especially preferably of 17.5-65% by weight of fluorine.

The fluorourethanes of the formula (III) are obtainable by reacting isocyanates of the formula $R[NCO]_n$ with fluorinated alcohols in a stoichiometric ratio to one another with urethane formation.

Preferred isocyanates of the formula $R[NCO]_n$ are methyl isocyanate, ethyl isocyanate, the isomeric propyl isocyanates, the isomeric butyl isocyanates, the isomeric pentyl isocyanates, the isomeric hexyl isocyanates, the isomeric heptyl isocyanates, the isomeric octyl isocyanates, the isomeric nonyl isocyanates, the isomeric decyl isocyanates, stearyl isocyanate, cyclopropyl isocyanate, cyclobutyl isocyanate, cyclopentyl isocyanate, cyclohexyl isocyanate, cycloheptyl isocyanate, 2-methylpentane 1,5-diisocyanate (MPDI), dodecamethylene diisocyanate, 1,8-diisocyanato-4-(isocyanatomethyl)octane (TIN), 6-diisocyanatohexane (HDI, Desmodur H), 1-isocyanato-3,3,5-trimethyl-5-isocyanatomethylcyclohexane (IPDI, Desmodur I), 2,4,4-trimethylhexane 1,6-diisocyanate (TMDI), dicyclohexylmethane diisocyanate (Desmodur W), hexahydrotolylene diisocyanate (H6TDI), bis(4-isocyanatocyclohexyl)methane (H12-MDI), 1,3-bis(isocyanatomethyl)cyclohexane, Desmodur LD, Desmodur N 100, Desmodur N3200, Desmodur N3300, Desmodur N3350, Desmodur N3368, Desmodur N3375, Desmodur N3390, Desmodur N3400, Desmodur N3600, Desmodur N3790, Desmodur N3800, Desmodur N3900, Desmodur N50, Desmodur N75, Desmodur NZ1, Desmodur PL340, Desmodur PL350, Desmodur PM76, Desmodur BL3175, Desmodur BL3272, Desmodur BL3370, Desmodur BL3475, Desmodur BL4265, Desmodur BL5375, Desmodur BLXP2677, Desmodur DA-L, Desmodur DN, Desmodur E 305, Desmodur E3265, Desmodur E3370, Baymicron OXA, Desmodur VP LS 2078/2, Desmodur VP LS 2114/1, Desmodur VP LS 2257, Desmodur VP LS 2352/1, Desmodur VP LS 2371, Desmodur VP LS 2376/1, Desmodur XP 2406, Desmodur XP 2489, Desmodur XP 2565, Desmodur XP 2580, Desmodur XP 2599, Desmodur XP 2617, Desmodur XP 2626, Desmodur XP 2675, Desmodur XP 2679, Desmodur XP 2714, Desmodur XP 2730, Desmodur XP 2731, Desmodur XP 2742, Desmodur XP 2748, Desmodur Z 4470 or mixtures thereof.

Particularly preferred isocyanates of the formula $R[NCO]_n$ are isomeric propyl isocyanates, the isomeric butyl isocyanates, the isomeric pentyl isocyanates, the isomeric hexyl isocyanates, the isomeric heptyl isocyanates, the isomeric octyl isocyanates, the isomeric nonyl isocyanates, the isomeric decyl isocyanates, stearyl isocyanate, 1,8-diisocyanato-4-(isocyanatomethyl)octane (TIN), 6-diisocyanatohexane (HDI, Desmodur H), 1-isocyanato-3,3,5-trimethyl-5-isocyanatomethylcyclohexane (IPDI, Desmodur I), 2,4,4-trimethylhexane 1,6-diisocyanate (TMDI), dicyclohexylmethane diisocyanate (Desmodur W), hexahydrotolylene diisocyanate (H6TDI), 1,3-bis(isocyanatomethyl)-cyclohexane, Desmodur LD, Desmodur N3400, Desmodur N3600, Baymicron OXA or mixtures thereof.

Very particularly preferred isocyanates of the formula $R[NCO]_n$ are isopropyl isocyanate, n-butyl isocyanate, n-hexyl isocyanate, n-octyl isocyanate, n-decyl isocyanate, cyclohexyl isocyanate, stearyl isocyanate, 1,8-diisocyanato-4-(isocyanatomethyl)octane (TIN), 6-diisocyanatohexane (HDI, Desmodur H), 1-isocyanato-3,3,5-trimethyl-5-isocyanatomethylcyclohexane (IPDI, Desmodur I), 2,4,4-trimethylhexane 1,6-diisocyanate (TMDI), dicyclohexylmethane diisocyanate (Desmodur W), hexahydrotolylene diisocyanate (H6TDI), 1,3-bis(isocyanatomethyl)cyclohexane, Desmodur LD, Desmodur N3400, Desmodur N3600, Desmodur N3900, Baymicron OXA or mixtures thereof.

The possible choice of the fluorinated alcohols is broad, and it is preferable to use primary or secondary, mono-, di- or trifunctional alcohols having a fluorine content of 30% to 82% of fluorine, particularly preferably having a fluorine content of 40% to 80% of fluorine and especially preferably having a fluorine content of 49% to 75% of fluorine.

The reaction of isocyanates with alcohols of the type mentioned in each case above for the preparation of the fluorourethanes is a urethanization. The reaction can be effected with the aid of the catalysts known for accelerating isocyanate addition reactions, such as, for example, tertiary amines, tin, zinc, iron or bismuth compounds, in particular triethylamine, 1,4-diazabicyclo[2.2.2]octane, bismuth octoate, zinc octoate or dibutyltin dilaurate, which can be initially introduced or metered in later.

The fluorourethanes may have a content of isocyanate groups (M=42 g/mol) or free isocyanate radical monomers of less than 0.5% by weight, preferably of less than 0.2% by weight, particularly preferably of less than 0.1% by weight.

Furthermore, the fluorourethanes may have contents of unreacted hydroxy-functional compounds of less than 1% by weight, preferably of less than 0.5% by weight and particularly preferably of less than 0.2% by weight.

The fluorourethanes may have a fluorine content of 10-80% by weight of fluorine, preferably of 12.5-75% by weight of fluorine, particularly preferably of 15-70% by weight of fluorine and especially preferably of 17.5-65% by weight of fluorine.

The fluorourethanes have a refractive index $n_D^{20}$ of ≤1.4600, preferably of ≤1.4500, particularly preferably of ≤1.4400 and especially preferably of ≤1.4300.

In the preparation of the fluorourethanes, the isocyanates and the alcohols may each be dissolved in a nonreactive solvent, for example an aromatic or aliphatic hydrocarbon or an aromatic or aliphatic halogenated hydrocarbon or a coating solvent, such as, for example, ethyl acetate or butyl acetate or acetone or butanone or an ether, such as tetrahydrofuran or tert-butyl methyl ether, or a dipolar aprotic solvent, such as dimethyl sulphoxide or N-methylpyrrolidone or N-ethylpyrrolidone, and may be initially introduced or metered in a manner familiar to the person skilled in the art.

After the end of the reaction, the unreactive solvents can be removed from the mixture under atmospheric pressure or under reduced pressure and the end point determined by determining the solids content. The solids contents are typically in a range from 99.999 to 95.0% by weight, preferably from 99.998 to 98.0% by weight, based on the fluorourethane.

The matrix polymers may be in particular polyurethanes. Preferably, the polyurethanes are obtainable by reacting an isocyanate component a) with an isocyanate-reactive component b).

The isocyanate component a) preferably comprises polyisocyanates. Polyisocyanates which may be used are all compounds well known per se to the person skilled in the art or mixtures thereof which have on average two or more NCO functions per molecule. These may have an aromatic, araliphatic, aliphatic or cycloaliphatic basis. In minor amounts, it is also possible concomitantly to use monoisocyanates and/or poly isocyanates containing unsaturated groups.

For example, butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-tolylene diisocyanate, 1,5-naphthylene diisocyanate, 2,4'- or 4,4'-diphenylmethane diisocyanate and/or triphenylmethane 4,4',4"-triisocyanate are suitable.

The use of derivatives of monomeric di- or triisocyanates having urethane, urea, carbodiimide, acylurea, isocyanurate, allophanate, biuret, oxadiazinetrione, uretdione and/or iminooxadiazinedione structures is also possible.

The use of polyisocyanates based on aliphatic and/or cycloaliphatic di- or triisocyanates is preferred.

Particularly preferably, the polyisocyanates of component a) are dimerized or oligomerized aliphatic and/or cycloaliphatic di- or triisocyanates.

Isocyanurates, uretdiones and/or iminooxadiazinediones based on HDI, 1,8-diisocyanato-4-(isocyanatomethyl)octane or mixtures thereof are very particularly preferred.

It is also possible to use NCO-functional prepolymers having urethane, allophanate, biuret and/or amide groups as component a). Prepolymers of component a) are obtained in a manner well known per se to the person skilled in the art by reacting monomeric, oligomeric or polyisocyanates a1) with isocyanate-reactive compounds a2) in suitable stoichiometry with optional use of catalysts and solvents.

Suitable polyisocyanates a1) are all aliphatic, cycloaliphatic, aromatic or araliphatic di- and triisocyanates known per se to the person skilled in the art, it being unimportant whether these were obtained by means of phosgenation or by phosgene-free processes. In addition, it is also possible to use the higher molecular weight secondary products of monomeric di- and/or triisocyanates having a urethane, urea, carbodiimide, acylurea, isocyanurate, allophanate, biuret, oxadiazinetrione, uretdione or iminooxadiazinedione structure, in each case individually or as any desired mixtures with one another, which secondary products are well known per se to the person skilled in the art.

Examples of suitable monomeric di- or triisocyanates which can be used as component a1) are butylene diisocyanate, hexamethylene diisocyanate (HDI), isophorone diisocyanate (IPDI), trimethyl-hexamethylene diisocyanate (TMDI), 1,8-diisocyanato-4-(isocyanatomethyl)octane, isocyanato-methyl-1,8-octane diisocyanate (TIN), 2,4- and/or 2,6-toluene diisocyanate.

OH-functional compounds are preferably used as isocyanate-reactive compounds a2) for the synthesis of the prepolymers. These are analogous to the OH-functional compounds as described below for the component b).

Also possible is the use of amines for the prepolymer preparation. For example ethylenediamine, diethylenetriamine, triethylenetetramine, propylenediamine, diaminocyclohexane, diaminobenzene, diaminobisphenyl, difunctional polyamines, such as, for example, the Jeffamine®, amine-terminated polymers having number average molar masses of up to 10 000 g/mol or any desired mixtures thereof with one another, are suitable.

For the preparation of prepolymers containing biuret groups, isocyanate is reacted in excess with amine, a biuret group forming in the process. Suitable amines in this case for the reaction with the di-, tri- and polyisocyanates mentioned are all oligomeric or polymeric, primary or secondary, difunctional amines of the abovementioned type.

Preferred prepolymers are urethanes, allophanates or biurets obtained from aliphatic isocyanate-functional compounds and oligomeric or polymeric isocyanate-reactive compounds having number average molar masses of 200 to 10 000 g/mol; urethanes, allophanates or biurets obtained from aliphatic isocyanate-functional compounds and oligomeric or polymeric polyols or polyamines having number average molar masses of 500 to 8500 g/mol are particularly preferred and allophanates obtained from HDI or TMDI and difunctional polyether polyols having number average molar masses of 1000 to 8200 g/mol are very particularly preferred.

The prepolymers described above preferably have residual contents of free monomeric isocyanate of less than 1% by weight, particularly preferably less than 0.5% by weight, very particularly preferably less than 0.2% by weight.

Of course, the isocyanate component may contain proportionately further isocyanate components in addition to the prepolymers described. Aromatic, araliphatic, aliphatic and cycloaliphatic di-, tri- or polyisocyanates are suitable for this purpose. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate (TMDI), the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-tolylene diisocyanate, 1,5-naphthylene diisocyanate, 2,4'- or 4,4'-diphenylmethane diisocyanate, triphenyl-methane 4,4',4"-triisocyanate or derivatives thereof having a urethane, urea, carbodiimide, acylurea, isocyanurate, allophanate, biuret, oxadiazinetrione, uretdione or iminooxadiazinedione structure and mixtures thereof. Polyisocyanates based on oligomerized and/or derivatized diisocyanates which were freed from excess diisocyanate by suitable methods are preferred, in particular those of hexamethylene diisocyanate. The oligomeric isocyanurates, uretdiones and iminooxadiazinediones of HDI and mixtures thereof are particularly preferred.

It is optionally also possible for the isocyanate component a) proportionately to contain isocyanates which are partly reacted with isocyanate-reactive ethylenically unsaturated compounds. α,β-unsaturated carboxylic acid derivatives, such as acrylates, methacrylates, maleates, fumarates, maleimides, acrylamides, and vinyl ethers, propenyl ethers, allyl ethers and compounds which contain dicyclopentadienyl units and have at least one group reactive towards isocyanates are preferably used here as isocyanate-reactive ethylenically unsaturated compounds; these are particularly preferably acrylates and methacrylates having at least one isocyanate-reactive group. For example, compounds such as 2-hydroxyethyl (meth)acrylate, polyethylene oxide mono(meth)acrylates, polypropylene oxide mono(meth)acrylates, polyalkylene oxide mono(meth)acrylates, poly(ε-caprolactone) mono(meth)-acrylates, such as, for example, Tone® M100 (Dow, USA), 2-hydroxypropyl (meth)acrylate, 4-hydroxybutyl (meth)acrylate, 3-hydroxy-2,2-dimethylpropyl (meth)acrylate, the hydroxy-functional mono-, di- or tetra (meth)acrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof are suitable as hydroxy-functional acrylates or methacrylates. In addition, isocyanate-reactive oligomeric or polymeric unsaturated compounds containing acrylate and/or methacrylate groups, alone or in combination with the abovementioned monomeric compounds, are suitable. The proportion of isocyanates which are partly reacted with isocyanate-reactive ethylenically unsaturated compounds, based on the isocyanate component a), is 0 to 99%, preferably 0 to 50%, particularly preferably 0 to 25% and very particularly preferably 0 to 15%.

It is optionally also possible for the abovementioned isocyanate component a) completely or proportionately to contain isocyanates which are completely or partly reacted with blocking agents known to the person skilled in the art from coating technology. The following may be mentioned as an example of blocking agents: alcohols, lactams, oximes, malonic esters, alkyl acetoacetates, triazoles, phenols, imidazoles, pyrazoles and amines, such as, for example, butanone oxime, diisopropylamine, 1,2,4-triazole, dimethyl-1,2,4-triazole, imidazole, diethyl malonate, ethyl acetoacetate, acetone oxime, 3,5-dimethylpyrazole, ε-caprolactam, N-tert-butylbenzylamine, cyclopentanone carboxyethyl ester or any desired mixtures of these blocking agents.

In principle, all polyfunctional, isocyanate-reactive compounds which have on average at least 1.5 isocyanate-reactive groups per molecule can be used as component b).

Isocyanate-reactive groups in the context of the present invention are preferably hydroxy, amino or thio groups; hydroxy compounds are particularly preferred.

Suitable polyfunctional, isocyanate-reactive compounds are, for example, polyester-, polyether-, polycarbonate-, poly(meth)acrylate- and/or polyurethanepolyols.

Suitable polyester polyols are, for example, linear polyester diols or branched polyester polyols, as can be obtained in a known manner from aliphatic, cycloaliphatic or aromatic di- or polycarboxylic acids or their anhydrides with polyhydric alcohols having an OH functionality of ≥2.

Examples of such di- or polycarboxylic acids or anhydrides are succinic, glutaric, adipic, pimelic, suberic, azelaic, sebacic, nonanedicarboxylic, decanedicarboxylic, terephthalic, isophthalic, o-phthalic, tetrahydrophthalic, hexahydrophthalic or trimellitic acid and acid anhydrides, such as o-phthalic, trimellitic or succinic anhydride, or any desired mixtures thereof with one another.

Examples of such suitable alcohols are ethanediol, di-, tri- and tetraethylene glycol, 1,2-propanediol, di-, tri- and tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, trimethylolpropane, glycerol or any desired mixtures thereof with one another.

The polyester polyols may also be based on natural raw materials, such as castor oil. It is also possible for the polyester polyols to be based on homo- or copolymers of lactones, as can preferably be obtained by an addition reaction of lactones or lactone mixtures, such as butyrolactone, ε-caprolactone and/or methyl-ε-caprolactone, with hydroxy-functional compounds, such as polyhydric alcohols having an OH functionality of ≥2, for example of the abovementioned type.

Such polyester polyols preferably have number average molar masses of 400 to 4000 g/mol, particularly preferably of 500 to 2000 g/mol. Their OH functionality is preferably 1.5 to 3.5, particularly preferably 1.8 to 3.0.

Suitable polycarbonate polyols are obtainable in a manner known per se by reacting organic carbonates or phosgene with diols or diol mixtures.

Suitable organic carbonates are dimethyl, diethyl and diphenyl carbonate.

Suitable diols or mixtures comprise the polyhydric alcohols known per se in relation to the polyester segments and having an OH functionality of ≥2, preferably 1,4-butanediol, 1,6-hexanediol and/or 3-methylpentanediol, or polyester polyols can be converted into polycarbonate polyols.

Such polycarbonatepolyols preferably have number average molar masses of 400 to 4000 g/mol, particularly preferably of 500 to 2000 g/mol. The OH functionality of these polyols is preferably 1.8 to 3.2, particularly preferably 1.9 to 3.0.

Suitable polyether polyols are optionally polyadducts of cyclic ethers with OH- or NH-functional starter molecules, which polyadducts have a block structure.

Suitable cyclic ethers are, for example, styrene oxides, ethylene oxide, propylene oxide, tetrahydrofuran, butylene oxide, epichlorohydrin and any desired mixtures thereof.

The polyhydric alcohols mentioned in relation to the polyester polyols and having an OH functionality of ≥2 and primary or secondary amines and amino alcohols may be used as starters.

Preferred polyether polyols are those of the abovementioned type, exclusively based on propylene oxide or random or block copolymers based on propylene oxide with further 1-alkylene oxides, the proportion of 1-alkylene oxide not being higher than 80% by weight. In addition, poly(trimethylene oxides) and mixtures of the polyols mentioned as being preferred are preferred. Propylene oxide homopolymers and random or block copolymers which have oxyethylene, oxypropylene and/or oxybutylene units are particularly preferred, the proportion of the oxypropylene units, based on the total amount of all oxyethylene, oxypropylene and oxybutylene units, accounting for at least 20% by weight, preferably at least 45% by weight. Here, oxypropylene and oxybutylene comprise all respective linear and branched $C_3$ and $C_4$ isomers.

Such polyether polyols preferably have number average molar masses of 250 to 10 000 g/mol, particularly preferably of 500 to 8500 g/mol and very particularly preferably of 600 to 4500 g/mol. The OH functionality is preferably 1.5 to 4.0, particularly preferably 1.8 to 3.1.

In addition, aliphatic, araliphatic or cycloaliphatic di-, tri- or polyfunctional alcohols having a low molecular weight, i.e. having molecular weights of less than 500 g/mol, and having a short chain, i.e. containing 2 to 20 carbon atoms, are also suitable as constituents of component b), as polyfunctional, isocyanate-reactive compounds.

These may be, for example, ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butyl-propanediol, trimethylpentanediol, positional isomers of diethyloctanediols, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl)propane), 2,2-dimethyl-3-hydroxypropionic acid (2,2-dimethyl-3-hydroxypropyl ester). Examples of suitable triols are trimethylolethane, trimethylolpropane or glycerol. Suitable high-functional alcohols are ditrimethylolpropane, pentaerythritol, dipentaerythritol or sorbitol.

One or more photoinitiators are used as component c). These are usually initiators which can be activated by actinic radiation and initiate a polymerization of the corresponding polymerizable groups. Photoinitiators are commercially distributed compounds known per se, the distinction being made between monomolecular (type I) and bimolecular (type II) initiators. Furthermore, depending on their chemical nature, these initiators are used for free radical, anionic (or), cationic (or mixed) forms of the abovementioned polymerizations.

(Type I) systems for free radical photopolymerization are, for example, aromatic ketone compounds, e.g. benzophenones, in combination with tertiary amines, alkylbenzophenones, 4,4'-bis(dimethylamino)benzophenone (Michlers ketone), anthrone and halogenated benzophenones or mixtures of said types. Further suitable are (type II) initiators, such as benzoin and its derivatives, benzil ketals, acylphosphine oxides, e.g. 2,4,6-trimethylbenzoyldiphenylphosphine oxide, bisacylophosphine oxides, phenylglyoxylic esters, camphorquinone, alpha-aminoalkylphenones, alpha-, alpha-dialkoxyacetophenones, 1-[4-(phenylthio)phenyl]octane-1,2-dione 2-(O-benzoyloxime), differently substituted hexarylbisimidazoles (HABI) with suitable coinitiators, such as, for example, mercaptobenzoxazole and alpha-hydroxyalkylphenones. The photoinitiator systems described in EP-A 0223587 and consisting of a mixture of an ammonium arylborate and one or more dyes can also be used as a photoinitiator. Suitable ammonium arylborates are, for example, tetrabutylammonium triphenylhexylborate, tetrabutylammonium triphenylbutylborate, tetrabutylammonium trinaphthylbutylborate, tetramethylammonium triphenylbenzylborate, tetra(n-hexyl)ammonium (sec-butyl)triphenylborate, 1-methyl-3-octylimidazolium dipentyldiphenylborate, tetrabutylammonium tris-(4-tert-butyl)phenylbutylborate, tetrabutylammonium tris-(3-fluorophenyl)hexylborate and tetrabutylammonium tris-(3-chloro-4-methylphenyl)hexylborate. Suitable dyes are, for example, new methylene blue, thionine, basic yellow, pinacynol chloride, rhodamine 6G, gallocyanine, ethyl violet, Victoria blue R, Celestine blue, quinaldine red, crystal violet, brilliant green, astrazone orange G, darrow red, pyronine Y, basic red 29, pyrillium I, safranin 0, cyanine and methylene blue, azure A (Cunningham et al., RadTech'98 North America UV/EB Conference Proceedings, Chicago, Apr. 19-22, 1998).

The photoinitiators used for the anionic polymerization are as a rule (type I) systems and are derived from transition metal complexes of the first series. Mention should be made here of chromium salts, such as, for example, trans-$Cr(NH_3)_2(NCS)_4^-$ (Kutal et al, Macromolecules 1991, 24, 6872), or ferrocenyl compounds (Yamaguchi et al. Macromolecules 2000, 33, 1152). A further possibility of anionic polymerization consists in the use of dyes, such as crystal violet, leuconitrile or malachite green leuconitrile, which can polymerise cyanoacrylates by photolytic decomposition (Neckers et al. Macromolecules 2000, 33, 7761). However, the chromophore is incorporated into the polymer thereby so that the resulting polymers are coloured throughout.

The photoinitiators used for the cationic polymerization substantially comprise three classes: aryldiazonium salts, onium salts (here especially: iodonium, sulphonium and selenonium salts) and organometallic compounds. On irradiation both in the presence and in the absence of a hydrogen donor, phenyldiazonium salts can produce a cation which initiates the polymerization. The efficiency of the total system is determined by the nature of the counterion used for the diazonium compound. The not very reactive but very expensive $SbF_6^-$, $AsF_6^-$ or $PF_6^-$ is preferred here. These compounds are as a rule not very suitable for use in the coating of thin films since the surface quality is reduced (pinholes) by the nitrogen liberated after the exposure (Li et al., Polymeric Materials Science and Engineering, 2001, 84, 139). Very widely used and also commercially available in many forms are onium salts, especially sulphonium and iodonium salts. The photochemistry of these compounds has been investigated for a long time. After excitation, the iodonium salts decompose initially homolytically and thus produce a free radical and a radical anion which is stabilized by H abstraction and liberates a proton and then initiates the cation polymerization (Dektar et al. J. Org. Chem. 1990, 55, 639; J. Org. Chem., 1991, 56. 1838). This mechanism permits the use of iodonium salts also for free radical photopolymerization. Once again, the choice of the counterion is of considerable importance here; $SbF_6^-$, $AsF_6^-$ or $PF_6^-$ is likewise preferred. Otherwise, the choice of the substitution of the aromatic is entirely free in this structure class and is determined substantially by the availability of suitable starting building blocks for the synthesis. The sulphonium salts are compounds which decompose according to Norrish(II) (Crivello et al., Macromolecules, 2000, 33, 825). In the case of the sulphonium salts, too, the choice of the counterion is of critical importance, which manifests itself substantially in the curing rate of the polymers. The best results are obtained as a rule with $SbF_6$ salts. Since the self-absorption of iodonium and sulphonium salts is at <300 nm, these compounds must be appropriately sensitized for photopolymerization with near UV or short-wave visible light. This is effected by using more highly absorbing aromatics such as, for example, anthracene and derivatives (Gu et al., Am. Chem. Soc. Polymer Preprints, 2000, 41 (2), 1266) or phenothiazine or derivatives thereof (Hua et al, Macromolecules 2001, 34, 2488-2494).

It may also be advantageous to use mixtures of these compounds. Depending on the radiation source used for the curing, type and concentration of photoinitiator must be adapted in a manner known to the person skilled in the art. Further details are described, for example, in P. K. T. Oldring (Ed.), Chemistry & Technology of UV & EB Formulations For Coatings, Inks & Paints, Vol. 3, 1991, SITA Technology, London, pages 61-328.

Preferred photoinitiators c) are mixtures of tetrabutylammonium triphenylhexylborate, tetrabutylammonium triphenylbutylborate, tetrabutylammonium trinaphthylbutylborate, tetrabutylammonium tris-(4-tert-butyl)phenylbutylborate, tetrabutylammonium tris-(3-fluorophenyl)hexylborate and tetrabutylammonium tris-(3-chloro-4-methylphenyl)hexylborate with dyes, such as, for example astrazone orange G, methylene blue, new methylene blue, azure A, pyrillium 1, safranin O, cyanine, gallocyanine, brilliant green, crystal violet, ethyl violet and thionine.

As component d), very good results are obtainable with highly refracting acrylates as contrast-imparting components in photopolymer formulations, as described, for example, in U.S. Pat. No. 6,780,546.

It is therefore preferable according to the invention if, in the photopolymer formulation, the writing monomers are acrylates, particularly preferably those having a refractive index $n_D^{20}>1.50$. Urethane acrylates are very particularly preferred; aromatic urethane acrylates having a refractive index of $n_D^{20}>1.50$ at 589 nm, as described, for example, in WO2008/125199, are particularly preferred.

The present invention furthermore relates to media for recording visual holograms obtainable using fluorourethanes of the formula (I), the use of such media as optical elements or images or for image representation or projection and a method for recording a hologram in which such media are used.

The photopolymer formulation according to the invention may contain in particular 15 to 79, preferably 30 to 60, % by weight of matrix polymer, 5 to 50, preferably 10 to 40, % by weight of writing monomer, 1 to 10, preferably I to 3, % by weight of photoinitiator and 5 to 50, preferably 10 to 40, % by weight of fluorourethanes and 0 to 10% by weight of further additives, the sum of the constituents being 100% by weight.

A second aspect of the invention relates to a process for the preparation of a photopolymer formulation according to the invention, in which matrix polymers, writing monomers, photoinitiators and fluorourethanes as plasticizers are mixed to give the photopolymer formulation.

A third aspect of the invention relates to a photopolymer formulation obtainable by the process.

A fourth aspect of the invention relates to a sheet, a film, a layer, a layer structure or a moulding comprising the photopolymer formulation.

Layers, layer structures and mouldings comprising the photopolymer formulations according to the invention typically have $\Delta n$ values, measured by the method described in the section "Measurement of the holographic properties DE and $\Delta n$ of the holographic media by means of two-beam interference in reflection arrangement", of $\Delta n>0.0120$, preferably $>0.0130$, particularly preferably $>0.0140$, very particularly preferably $>0.0150$.

A fifth aspect of the invention relates to the use of the photopolymer formulation for the production of optical elements, in particular for the production of holographic elements and images.

The invention also relates to a method for exposing holographic media comprising a photopolymer formulation according to the invention, in which the writing monomers are selectively polymerized with spatial resolution by electromagnetic radiation.

After the holographic exposure, such holographic media are suitable for the production of holographic optical elements which have, for example, the function of an optical lens, a mirror, a deflection mirror, a filter, a diffuser screen, a diffraction element, a light conductor, a waveguide, a projection screen and/or a mask. In addition, it is also possible to produce holographic images or representations, such as, for example, for personal portraits, biometric representations in security documents or generally of images or image structures for advertising, security labels, trademark protection, trademark branding, labels, design elements, decorations, illustrations, multi-journey tickets, images and the like and images which can represent digital data, inter alia also in combination with the products described above.

The prior art discloses certain fluorourethanes. Thus, US 2003/105263 A1 describes fluorourethanes which are obtainable by reacting a biuret, isocyanurate, uretdione, polyurea contain the polyisocyanate with a fluorinated alcohol. WO 03/023519 A discloses fluorourethane that is obtainable by reacting a biuret-containing polyisocyanate with a fluorinated alcohol.

A further aspect of the invention relates to a fluorourethane obtainable by reacting a polyisocyanate which contains iminooxadiazinediones or oxadiazadione and has at least one free isocyanate group with an alcohol, the polyisocyanate and/or the alcohol being substituted by at least one fluorine atom.

Finally, the invention also relates to a fluorourethane according to the general formula (III)

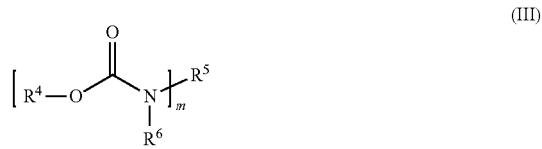

(III)

in which m is $\geq 1$ and m is $\leq 8$ and $R^4$, $R^5$, $R^6$ are hydrogen and/or, independently of one another, linear, branched, cyclic or heterocyclic organic radicals which are unsubstituted or optionally also substituted by heteroatoms and have iminooxadiazinedione and/or oxadiazadione structural elements, at the same time at least two of the radicals $R^4$, $R^5$, $R^6$ being substituted by at least one fluorine atom.

EXAMPLES

The invention is explained in more detail below with reference to examples.

Unless noted otherwise, all stated percentages are based on percent by weight.

Methods of Measurement:

The stated NCO values (isocyanate contents) were determined according to DIN EN ISO 11909.

The measurement of the refractive index was effected by one of the following three methods, depending on the nature of the example compound:

Measurement of the refractive index n at a wavelength of 405 nm (Method A): the refractive index n as a function of the wavelength of the samples were obtained from the transmission and reflection spectra. For this purpose, about 100-300 nm thick films of the samples were applied by spin coating to quartz glass substrates from dilute solution in butyl acetate. The transmission and reflection spectrum of this layer packet was measured with a spectrometer from STEAG ETA-Optik, CD-Measurement System ETA-RT, and the layer thickness and the spectral curve of n were then fitted to the measured transmission and reflection spectra. This is effected using the internal software of the spectrometer and additionally requires the n data of the quartz glass substrate, which were determined beforehand in a blank measurement.

Measurement of the refractive index $n_D^{20}$ at a wavelength of 589 nm (Method B): a sample of the example compound was introduced into an Abbe refractometer and the $n_D^{20}$ was then measured.

Measurement of the refractive index $n_D^{20}$ at a wavelength of 589 nm from semiconcentrated solution (Method C): a sample of the example compound was diluted 50:50 (% by weight) with N-ethylpyrrolidone and introduced into an Abbe refractometer and the $n_D^{20}$ was then measured. The approximate refractive index of the analyte was calculated therefrom; the $n_D^{20}$ of N-ethylpyrrolidone was 1.4658.

Measurement of the Holographic Properties DE and Δn of the Holographic Media by Means of Two-Beam Interference in Reflection Arrangement The media produced were then tested with regard to their holographic properties by means of a measuring arrangement according to FIG. 1, as follows:

The beam of an He—Ne laser (emission wavelength 633 nm) was converted with the aid of the spatial filter (SF) and together with the collimation lens (CL) into a parallel homogeneous beam. The final cross section of the signal and reference beam are established by the iris diaphragms (I). The diameter of the iris diaphragm opening is 0.4 cm. The polarization-dependent beam splitters (PBS) split the laser beam into two coherent equally polarized beams. Via the λ/2 plates, the power of the reference beam was adjusted to 0.5 mW and the power of the signal beam to 0.65 mW. The powers were determined using the semiconductor detectors (D) with sample removed. The angle of incidence ($\alpha_0$) of the reference beam is −21.8° and the angle of incidence ($\beta_0$) of the signal beam is 41.8°. The angles are measured starting from the sample normal to the beam direction. According to FIG. 1, $\alpha_0$ therefore has a negative sign and $\beta_0$ a positive sign. At the location of the sample (medium), the interference field of the two overlapping beams produced a grating of light and dark strips which are perpendicular to the angle dissectors of the two beams incident on the sample (reflection hologram). The strip spacing Λ, also referred to as grating period, in the medium is ~225 nm (the refractive index of the medium assumed to be ~1.504).

FIG. 1 shows the geometry of a holographic media tester (HMT) at λ=633 nm (He—Ne laser): M=mirror, S=shutter, SF=spatial filter, CL=collimator lens, λ/2=λ/2 plate, PBS=polarization-sensitive beam splitter, D=detector, I=iris diaphragm, $\alpha_0$=−21.8°, $\beta_0$=41.8° are the angles of incidence of the coherent beams, measured outside the sample (outside the medium). RD=reference direction of the turntable.

The diffraction efficiency (DE) of the media was measured using an experimental holographic setup as shown in FIG. 1.

Holograms were recorded in the medium in the following manner:
both shutters (S) are opened for the exposure time t.
thereafter, with closed shutters (S), the medium was allowed a time of 5 minutes for diffusion of the as yet unpolymerized writing monomers.

The holograms recorded were now read in the following manner. The shutter of the signal beam remained closed. The shutter of the reference beam was open. The iris diaphragm of the reference beam was closed to a diameter of <1 mm. This ensured that the beam was always completely in the previously recorded hologram for all angles of rotation (Ω) of the medium. The turntable, under computer control, now covered the angle range from $\Omega_{min}$ to $\Omega_{max}$ with an angle step width of 0.05°. Ω is measured from the sample normal to the reference direction of the turntable. The reference direction of the turntable is obtained when the angle of incidence of the reference beam and that of the signal beam have the same magnitude, i.e. $\alpha_0$=−31.8° and $\beta_0$=31.8°, on recording of the hologram. $\Omega_{recording}$ is then 0°. For $\alpha_0$=−21.8° and $\beta_0$=41.8°, $\Omega_{recording}$ is therefore 10°. In general, the following is true for the interference field during recording of the hologram:

$$\alpha_O = \theta_0 + \Omega_{recording}.$$

$\theta_0$ is the semiangle in the laboratory system outside the medium and the following is true for recording of the hologram:

$$\theta_0 = \frac{\alpha_0 - \beta_0}{2}.$$

In this case, $\theta_0$ is therefore −31.8°. At each angle of rotation Ω approached, the powers of the beam transmitted in the zero order were measured by means of the corresponding detector D and the powers and the beam diffracted in the first order were measured by means of the detector D. The diffraction efficiency was obtained at each angle Ω approached as the quotient of:

$$\eta = \frac{P_D}{P_D + P_T}$$

$P_D$ is the power in the detector of the diffracted beam and $P_T$ is the power in the detector of the transmitted beam.

By means of the method described above, the Bragg curve (it describes the diffraction efficiency η as a function of the angle of rotation Ω of the recorded hologram) was measured and was stored in a computer. In addition, the intensity transmitted in the zero order was also plotted against the angle of rotation Ω and stored in a computer.

The maximum diffraction efficiency (DE=η max) of the hologram, i.e. its peak value, was determined in the case of $\Omega_{reconstruction}$. It may have been necessary for this purpose to change the position of the detector of the diffracted beam in order to determine this maximum value.

The refractive index contrast Δn and the thickness d of the photopolymer layer was now determined by means of the coupled wave theory (cf. H. Kogelnik, The Bell System Technical Journal, Volume 48, November 1969, Number 9 page 2909-page 2947) from the measured Bragg curve and the variation of the transmitted intensity as a function of angle. It should be noted that, owing to the thickness shrinkage occurring as a result of the photopolymerization, the strip spacing Λ' of the hologram and the orientation of the strips (slant) may deviate from the strip spacing Λ of the interference pattern and the orientation thereof. Accordingly, the angle $\Lambda_0'$ or the corresponding angle of the turntable $\Omega_{reconstruction}$ at which maximum diffraction efficiency is achieved will also deviate from 0 or from the corresponding $\Omega_{recording}$. As a result, the Bragg condition changes. This change is taken into account in the evaluation method. The evaluation method is described below:

All geometrical quantities which relate to the recorded hologram and not to the interference pattern are shown as dashed quantities.

According to Kogelnik, the following is true for the Bragg curve η(Ω) of a reflection hologram:

$$\eta = \begin{cases} \dfrac{1}{1 - \dfrac{1-(\xi/\nu)^2}{\sin^2\left(\sqrt{\xi^2-\nu^2}\right)}}, & \text{for } \nu^2 - \xi^2 < 0 \\[2ex] \dfrac{1}{1 + \dfrac{1-(\xi/\nu)^2}{\sinh^2\left(\sqrt{\nu^2-\xi^2}\right)}}, & \text{for } \nu^2 - \xi^2 \geq 0 \end{cases}$$

with:

$$\nu = \frac{\pi \cdot \Delta n \cdot d'}{\lambda \cdot \sqrt{|c_s \cdot c_r|}}$$

-continued $$\xi = -\frac{d'}{2 \cdot c_s} \cdot DP$$

$$c_s = \cos(\vartheta') - \cos(\psi') \cdot \frac{\lambda}{n \cdot \Lambda'}$$

$$c_r = \cos(\vartheta')$$

$$DP = \frac{\pi}{\Lambda'} \cdot \left(2 \cdot \cos(\psi' - \vartheta') - \frac{\lambda}{n \cdot \Lambda'}\right)$$

$$\psi' = \frac{\beta' + \alpha'}{2}$$

$$\Lambda' = \frac{\lambda}{2 \cdot n \cdot \cos(\psi' - \alpha')}$$

On reading the hologram ("reconstruction") the following is true as described analogously above:

$$\Theta'_0 = \theta_0 + \Omega$$

$$\sin(\Theta_0) = n \cdot \sin(\Theta')$$

Under the Bragg condition, the "dephasing" DP is 0. Accordingly:

$$\alpha'_0 = \theta_0 + \Omega_{reconstruction}$$

$$\sin(\alpha'_0) = n \cdot \sin(\alpha')$$

The still unknown angle β' can be determined from the comparison of the Bragg condition of the interference field on recording of the hologram and the Bragg condition on reading of the hologram, assuming that only thickness shrinkage takes place. The following then follows:

$$\sin(\beta') = \frac{1}{n} \cdot [\sin(\alpha_0) + \sin(\beta_0) - \sin(\theta_0 + \Omega_{reconstruction})]$$

ν is the grating thickness, ξ is the detuning parameter and ψ' is the orientation (slant) of the refractive index grating which was recorded. α' and β' correspond to the angles α0 and β0 of the interference field on recording of the hologram, but measured in the medium and applicable to the grating of the hologram (after thickness shrinkage). n is the mean refractive index of the photopolymer and was set at 1.504. λ is the wavelength of the laser light in vacuo.

The maximum diffraction efficiency (DE=ηmax) is then obtained for ξ=0 as:

$$DE = \tanh^2(v) = \tanh^2\left(\frac{\pi \cdot \Delta n \cdot d'}{\lambda \cdot \sqrt{\cos(\alpha') \cdot \cos(\alpha' - 2\psi)}}\right)$$

Figure 2:
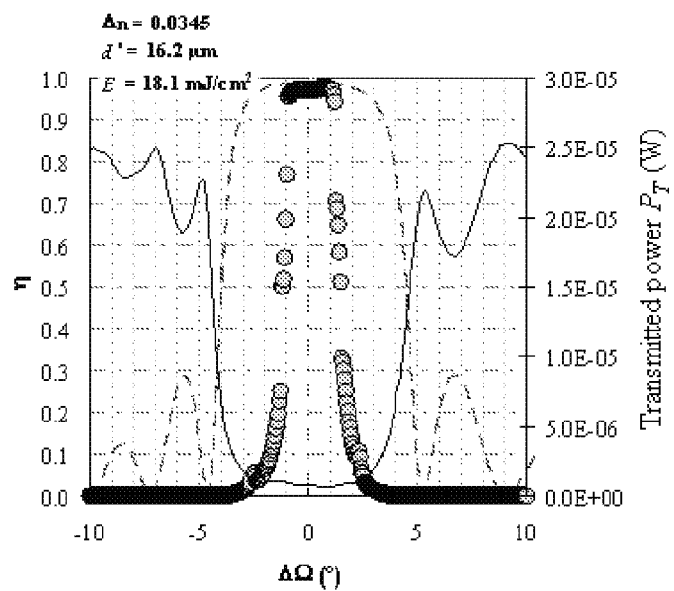
FIG. 2 illustrates a graph showing the measured data of the diffraction efficiency, the theoretical Bragg curve and the transmitted intensity are, plotted against the angle detuning.

FIG. 2 shows the measured transmitted power $P_T$ (right y axis) as a solid line, plotted against the angle detuning ΔΩ, the measured diffraction efficiency η (left y axis) as solid circles, plotted against the angle detuning ΔΩ (if permitted by the finite size of the detector) and the fit of the Kogelnik theory as a dashed line (lefty axis).

The measured data of the diffraction efficiency, the theoretical Bragg curve and the transmitted intensity are, as shown in FIG. 2, plotted against the centred angle of rotation $\Delta\Omega \equiv \Omega_{reconstruction} - \Omega = \alpha'_0 - \Theta'_0$, also referred to as angle detuning.

Since DE is known, the shape of the theoretical Bragg curve according to Kogelnik is determined only by the thickness d' of the photopolymer layer. An is subsequently corrected for a given thickness d' using DE so that measurement and theory of DE always agree. d' is now adjusted until the angle positions of the first secondary minima of the theoretical Bragg curve agree with the angle positions of the first secondary maxima of the transmitted intensity and additionally the full width at half height (FWHM) for the theoretical Bragg curve and for the transmitted intensity agree.

Since the direction in which a reflection hologram concomitantly rotates on reconstruction by means of an Ω scan, but the detector for the diffracted light can detect only a finite angle range, the Bragg curve of broad holograms (small d') is not completely detected in an Ω scan, but only the central region, with suitable detector positioning. The shape of the transmitted intensity which is complementary to the Bragg curve is therefore additionally used for adjusting the layer thickness d'.

FIG. 2 shows the plot of the Bragg curve η according to the coupled wave theory (dashed line), of the measured diffraction efficiency (solid circles) and of the transmitted power (black solid line) against the angle detuning ΔΩ.

For a formulation, this procedure was possibly repeated several times for different exposure times t on different media in order to determine the average energy dose of the incident laser beam at which DE reaches the saturation value during recording of the hologram. The average energy dose E is obtained from the powers of the two part-beams coordinated with the angles $\alpha_0$ and $\beta_0$ (reference beam with $P_r$=0.50 mW and signal beam with $P_s$=0.63 mW), the exposure time t and the diameter of the iris diaphragm (0.4 cm), as follows:

$$E(mJ/cm^2) = \frac{2 \cdot [P_r + P_s] \cdot t(s)}{\pi \cdot 0.4^2 cm^2}$$

The powers of the part-beams were adjusted so that the same power density is achieved in the medium at the angles $\alpha_0$ and $\beta_0$ used.

Substances Used:

Fluorlink E 10/H is a reactive additive produced by Solvay Solexis and based on a fluorinated alcohol having the average molecular weight of 750 g/mol.

CGI-909 (tetrabutylammonium tris(3-chloro-4-methylphenyl)(hexyl)borate, [1147315-11-4]) is an experimental product produced by CIBA Inc., Basle, Switzerland.

1,8-Diisocyanato-4-(isocyanatomethyl)octane (TIN) was prepared as described in EP749958.

The fluorinated alcohols and monofunctional isocyanates used were obtained from the chemical trade, and the polyisocyanates used (Desmodur H (HDI), Desmodur I (IPDI), Desmodur W, Desmodur LD, Desmodur N3400, Desmodur N3600, Desmodur N3900, Baymicron OXA) are commercial products of Bayer MaterialScience AG, Leverkusen, Germany.

2,4,4-Trimethylhexane 1,6-diisocyanate, Vestanat TMDI, is a product of Evonik Degussa GmbH, Marl, Germany.

Preparation of 2,2,2-trifluoroethyl (6-isocyanatohexyl)carbamate 684 g of hexamethylene diisocyanate (HDI) were initially introduced at 80° C. in a 1 l round-bottomed flask and 0.002 g of isophthaloyl dichloride was added. 54.4 g of trifluoroethanol were slowly added dropwise and stirring was effected until the NCO value was 43.2% by weight. The mixture was separated by distillation on a thin-film evaporator and 47 g (=47% of theory) of the title compound having an NCO content of 22.7% by weight were obtained.

Preparation of 2,2,3,3,4,4,5,5-octafluoropentyl (6-isocyanatohexyl)carbamate 399 g of hexamethylene diisocyanate (HDI) were initially introduced at 80° C. in a 1 l round-bottomed flask and 0.002 g of isophthaloyl dichloride was added. 73.4 g of 2,2,3,3,4,4,5,5-octafluoropentanol were slowly added dropwise and stirring was effected until the NCO value was 39.4% by weight. The mixture was separated by distillation on a thin-film evaporator and 40 g (=40% of theory) of the title compound having an NCO content of 12.4% by weight were obtained.

Example 1

Bis(2,2,2-trifluoroethyl)hexane-1,6-diyl biscarbamate 0.07 g of Desmorapid Z and 64.4 g of 6-diisocyanatohexane (HDI) were initially introduced into a 500 ml round-bottomed flask and heated to 60° C. Thereafter, 81.5 g of trifluoroethanol were added dropwise and the mixture was further kept at 60° C. until the isocyanate content had fallen below 0.1%. Cooling was then effected. The product was obtained as a colourless solid.

The examples described below in Table 1 were prepared in the manner described in Example 1, in the stated compositions.

TABLE 1

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
| 2 | 2,2,2-Trifluoroethyl butylcarbamate | n-Butyl isocyanate 498 g | Trifluoroethanol 502 g | Desmorapid Z 0.50 g | 60° C. | colourless liquid | 1.3900 (B) |
| 3 | 2,2,2-Trifluoroethyl isopropylcarbamate | Isopropyl isocyanate 22.9 g | Trifluoroethanol 27.0 g | Desmorapid Z 0.02 g | 60° C. | colourless solid | 1.3834 (C) |
| 4 | 2,2,2-Trifluoroethyl hexylcarbamate | n-Hexyl isocyanate 55.9 g | Trifluoroethanol 44.0 g | Desmorapid Z 0.05 g | 60° C. | colourless liquid | 1.3984 (B) |
| 5 | 1,1,1,3,3,3-Hexafluoropropan-2-yl hexylcarbamate | n-Hexyl isocyanate 10.8 g | Hexafluoro-2-propanol 14.2 g | Desmorapid Z 0.01 g | 60° C. | colourless liquid | 1.3711 (B) |
| 6 | 2,2,3,3-Tetrafluoropropyl hexylcarbamate | n-Hexyl isocyanate 12.3 g | 2,2,3,3-Tetrafluoropropan-1-ol 12.7 g | Desmorapid Z 0.01 g | 60° C. | colourless liquid | 1.4020 (B) |
| 7 | 1,1,1,3,3,3-Hexafluoropropan-2-yl butylcarbamate | n-Butyl isocyanate 9.3 g | Hexafluoro-2-propanol 15.7 g | Desmorapid Z 0.01 g | 60° C. | colourless solid | 1.3650 (C) |
| 8 | 2,2,3,3-Tetrafluoropropyl butylcarbamate | n-Butyl isocyanate 10.7 g | 2,2,3,3-Tetrafluoropropan-1-ol 14.3 g | Desmorapid Z 0.01 g | 60° C. | colourless liquid | 1.4100 (A) |
| 9 | 1,1,1,3,3,3-Hexafluoropropan-2-yl octylcarbamate | n-Octyl isocyanate 9.6 g | Hexafluoro-2-propanol 10.4 g | Desmorapid Z 0.01 g | 60° C. | colourless solid | 1.3910 (A) |
| 10 | 2,2,2-Trifluoroethyl octylcarbamate | n-Octyl isocyanate 12.2 g | Trifluoroethanol 7.8 g | Desmorapid Z 0.01 g | 60° C. | colourless liquid | 1.4083 (B) |
| 11 | 1,1,1,3,3,3-Hexafluoropropan-2-yl octylcarbamate | n-Decyl isocyanate 10.4 g | Hexafluoro-2-propanol 9.6 g | Desmorapid Z 0.01 g | 60° C. | colourless solid | 1.4022 (C) |
| 12 | 2,2,2-Trifluoroethyl decylcarbamate | n-Decyl isocyanate 12.9 g | Trifluoroethanol 7.1 g | Desmorapid Z 0.01 g | 60° C. | colourless solid | 1.4178 (C) |
| 13 | Bis(1,1,1,3,3,3-hexafluoropropan-2-yl) hexane-1,6-diylbiscarbamate | 6-Diisocyanato-hexane (HDI) 6.7 g | Hexafluoro-2-propanol 13.3 g | Desmorapid Z 0.01 g | 60° C. | colourless solid | 1.4300 (A) |
| 14 | Bis(1,1,1,3,3,3-hexafluoropropan-2-yl)-(2,2,4-trimethylhexane-1,6-diyl) biscarbamate | 2,4,4-Trimethyl-hexane 1,6-diisocyanate (TMDI) 50.0 g | Hexafluoro-2-propanol 80.0 g | Desmorapid Z 0.07 g | 60° C. | colourless liquid | 1.4270 (A) |
| 15 | Bis(2,2,2-trifluoroethyl)-(2,2,4-trimethylhexane-1,6-diyl) biscarbamate | 2,4,4-Trimethyl-hexane 1,6-diisocyanate (TMDI) 496 g | Trifluoroethanol 463 g | Desmorapid Z 0.48 G | 60° C. | colourless liquid | 1.4800 (A) |
| 16 | 1,1,1,3,3,3-Hexafluoropropan-2-yl stearylcarbamate | Stearyl isocyanate 12.7 g | Hexafluoro-2-propanol 7.27 g | Desmorapid Z 0.01 g | 60° C. | colourless solid | n.d. |
| 17 | 2,2,2-Trifluoroethyl stearylcarbamate | Stearyl isocyanate 14.9 g | Trifluoroethanol 5.1 g | Desmorapid Z 0.01 g | 60° C. | colourless solid | n.d. |
| 18 | Bis(1,1,1,3,3,3-hexafluoropropan-2-yl)-{4-[({[(1,1,1,3,3,3-hexafluoropropan-2-yl)oxy]carbonyl}-amino)methyl]octane-1,8-diyl} biscarbamate | 1,8-Diisocyanato-4-(isocyanatomethyl)-octane (TIN) 3.33 g | Hexafluoro-2-propanol 6.66 g | Desmorapid Z 0.01 g | 60° C. | colourless solid | 1.3920 (B) |
| 19 | Bis(2,2,2-trifluoroethyl)-[4-({[(2,2,2-trifluoroethoxy)carbonyl]amino}-methyl)octane-1,8-diyl] biscarbamate | 1,8-Diisocyanato-4-(isocyanatomethyl)-octane (TIN) 228 g | Trifluoroethanol 272 g | Desmorapid Z 0.48 g | 60° C. | colourless liquid | 1.4213 (B) |

TABLE 1-continued

Preparation and characterization of Examples 2-224

| Example | Name | Isocyanate and amount | Alcohol and amount | Catalyst and amount | Temp [°C.] | Description | Refractive index (Method) |
|---|---|---|---|---|---|---|---|
| 20 | 2,2,3,3,4,4,4-Heptafluorobutyl butylcarbamate | n-Butyl isocyanate 24.8 g | 2,2,3,3,4,4,4-Heptafluorobutanol 50.1 g | Desmorapid Z 0.04 g | 60° C. | colourless solid | 1.3625 (B) |
| 21 | 2,2,3,3,4,4,5,5,6,6,7,7,8,8,9,9-Hexadecafluorononyl butylcarbamate | n-Butyl isocyanate 186 g | 2,2,3,3,4,4,5,5,6,6,7,7,8,8,9,9-Hexadecafluorononanol 813 g | Desmorapid Z 0.50 g | 60° C. | colourless liquid | 1.3555 (B) |
| 22 | Bis(2,2,3,3,4,4,4-heptafluorobutyl)-(2,2,4-trimethylhexane-1,6-diyl) biscarbamate | 2,4,4-Trimethylhexane 1,6-diisocyanate (TMDI) 6.88 g | 2,2,3,3,4,4,4-Heptafluorobutanol 13.1 g | Desmorapid Z 0.01 g | 60° C. | colourless liquid | 1.3887 (B) |
| 23 | Bis(2,2,3,3,4,4,5,5,6,6,7,7,8,8,9,9-hexadecafluorononyl)-(2,2,4-trimethylhexane-1,6-diyl) biscarbamate | 2,4,4-Trimethylhexane 1,6-diisocyanate (TMDI) 3.91 g | 2,2,3,3,4,4,5,5,6,6,7,7,8,8,9,9-Hexadecafluorononanol 16.1 g | Desmorapid Z 0.01 g | 60° C. | colourless liquid | 1.3733 (B) |
| 24 | Bis(2,2,3,3,4,4,4-heptafluorobutyl)-[4-({[(2,2,3,3,4,4,4-heptafluorobutoxy)-carbonyl]amino}methyl)octane-1,8-diyl] biscarbamate | 1,8-Diisocyanato-4-(isocyanatomethyl)octane (TIN) 5.91 g | 2,2,3,3,4,4,4-Heptafluorobutanol 14.1 g | Desmorapid Z 0.01 g | 60° C. | colourless oil | 1.3876 (B) |
| 25 | Bis(2,2,3,3,4,4,5,5,6,6,7,7,8,8,9,9-hexadecafluorononyl)-{4-[({[(2,2,3,3,4,4,5,5,6,6,7,7,8,8,9,9-hexadecafluorononyl)oxy]carbonyl}-amino)methyl]octane-1,8-diyl} biscarbamate | 1,8-Diisocyanato-4-(isocyanatomethyl)-octane (TIN) 3.25 g | 2,2,3,3,4,4,5,5,6,6,7,7,8,8,9,9-Hexadecafluorononanol 16.7 g | Desmorapid Z 0.01 g | 60° C. | colourless oil | 1.3890 (C) |
| 26 | 2,2,3,3,4,4,5,5,5-Nonafluoropentyl butylcarbamate | n-Butyl isocyanate 4.25 g | 2,2,3,3,4,4,5,5,5-Nonafluoropentan-1-ol 10.7 g | Desmorapid Z 0.02 g | 70° C. | colourless liquid | 1.3580 (B) |
| 27 | Bis(2,2,3,3,4,4,5,5,5-nonafluoropentyl)-{4-[({[(2,2,3,3,4,4,5,5,5-nonafluoropentyl)oxy]carbonyl}-amino)methyl]octane-1,8-diyl} biscarbamate | 1,8-Diisocyanato-4-(isocyanatomethyl)-octane (TIN) 3.77 g | 2,2,3,3,4,4,5,5,5-Nonafluoropentan-1-ol 11.2 g | Desmorapid Z 0.02 g | 70° C. | colourless oil | 1.3786 (B) |
| 28 | Bis(2,2,3,3,4,4,5,5,5-nonafluoropentyl)-(2,2,4-trimethylhexane-1,6-diyl) biscarbamate | 2,4,4-Trimethylhexane 1,6-diisocyanate (TMDI) 4.43 g | 2,2,3,3,4,4,5,5,5-Nonafluoropentan-1-ol 10.6 g | Desmorapid Z 0.02 g | 70° C. | colourless liquid | 1.3820 (B) |
| 29 | Bis(2,2,3,3,4,4,5,5,5-nonafluoropentyl) hexane-1,6-diylbiscarbamate | 6-Diisocyanato-hexane (HDI) 3.77 g | 2,2,3,3,4,4,5,5,5-Nonafluoropentan-1-ol 11.2 g | Desmorapid Z 0.02 g | 70° C. | colourless solid | 1.3876 (C) |
| 30 | Bis(2,2,3,3,4,4,5,5,5-nonafluoropentyl) (methanediyldicyclohexane-4,1-diyl) biscarbamate | Dicyclohexyl-methane diisocyanate (Desmodur W) 5.15 g | 2,2,3,3,4,4,5,5,5-Nonafluoropentan-1-ol 9.83 g | Desmorapid Z 0.02 g | 70° C. | colourless solid | 1.4124 (C) |
| 31 | 2,2,3,3,4,4,5,5,5-Nonafluoropentyl-{[1,3,3-trimethyl-5-({[(2,2,3,3,4,4,5,5,5-nonafluoropentyl)oxy]carbonyl}-amino)cyclohexyl]methyl}carbamate | 1-Isocyanato-3,3,5-trimethyl-5-isocyanatomethyl-cyclohexane (IPDI) 4.61 g | 2,2,3,3,4,4,5,5,5-Nonafluoropentan-1-ol 10.4 g | Desmorapid Z 0.02 g | 70° C. | colourless solid | 1.3984 (C) |
| 32 | 2,2,3,3,4,4,5,5,5-Nonafluoropentyl hexylcarbamate | n-Hexyl isocyanate 5.05 g | 2,2,3,3,4,4,5,5,5-Nonafluoropentan-1-ol 9.94 g | Desmorapid Z 0.02 g | 70° C. | colourless liquid | 1.3690 (B) |
| 33 | Bis(2,2,3,3,4,4,5,5,5-nonafluoropentyl)-(4-methylcyclohexane-1,3-diyl) biscarbamate | Hexahydrotolylene diisocyanate (H6TDI) 3.97 g | 2,2,3,3,4,4,5,5,5-Nonafluoropentan-1-ol 11.0 g | Desmorapid Z 0.02 g | 70° C. | colourless oil | 1.3940 (C) |
| 34 | 2,2,3,3,4,4,5,5,5-Nonafluoropentyl propan-2-yl carbamate | Isopropyl isocyanate 3.81 g | 2,2,3,3,4,4,5,5,5-Nonafluoropentan-1-ol 11.2 g | Desmorapid Z 0.02 g | 70° C. | colourless liquid | 1.3497 (B) |
| 35 | 2,2,3,3,4,4,5,5,5-Nonafluoropentyl cyclohexyl carbamate | Cyclohexyl isocyanate 5.00 g | 2,2,3,3,4,4,5,5,5-Nonafluoropentan-1-ol 10.0 g | Desmorapid Z 0.02 g | 70° C. | colourless solid | 1.3952 (C) |
| 36 | 2,2,3,3,4,4,5,5,6,6,6-Undecafluorohexyl butylcarbamate | n-Butyl isocyanate 3.72 g | 2,2,3,3,4,4,5,5,6,6,6-Undecafluorohexan-1-ol 11.3 g | Desmorapid Z 0.02 g | 70° C. | colourless liquid | 1.3538 (B) |
| 37 | Bis(2,2,3,3,4,4,5,5,6,6,6-undecafluorohexyl)-{4- | 1,8-Diisocyanato-4-(isocyanato- | 2,2,3,3,4,4,5,5,6,6,6-Undecafluorohexan-1- | Desmorapid Z 0.02 g | 70° C. | colourless oil | 1.3721 (B) |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
|  | [({[(2,2,3,3,4,4,5,5,6,6,6-undecafluorohexyl)oxy]-carbonyl}amino)methyl]octane-1,8-diyl} biscarbamate | methyl)octane (TIN) 3.28 g | ol 11.7 g |  |  |  |  |
| 38 | Bis(2,2,3,3,4,4,5,5,6,6,6-undecafluorohexyl)-(2,2,4-trimethylhexane-1,6-diyl) biscarbamate | 2,4,4-Trimethylhexane 1,6-diisocyanate (TMDI) 3.88 g | 2,2,3,3,4,4,5,5,6,6,6-Undecafluorohexan-1-ol 11.1 g | Desmorapid Z 0.02 g | 70° C. | colourless oil | 1.3750 (B) |
| 39 | Bis(2,2,3,3,4,4,5,5,6,6,6-undecafluorohexyl) hexane-1,6-diylbiscarbamate | 6-Diisocyanate-hexane (HDI) 3.28 g | 2,2,3,3,4,4,5,5,6,6,6-Undecafluorohexan-1-ol 11.7 g | Desmorapid Z 0.02 g | 70° C. | colourless solid | 1.3826 (C) |
| 40 | Bis(2,2,3,3,4,4,5,5,6,6,6-undecafluorohexyl)-(methanediyldicyclohexane-4,1-diyl) biscarbamate | Dicyclohexylmethane diisocyanate (Desmodur W) 4.55 g | 2,2,3,3,4,4,5,5,6,6,6-Undecafluorohexan-1-ol 10.4 g | Desmorapid Z 0.02 g | 70° C. | colourless solid | 1.4084 (C) |
| 41 | 2,2,3,3,4,4,5,5,6,6,6-Undecafluorohexyl-{[1,3,3-trimethyl-5-({[(2,2,3,3,4,4,5,5,6,6,6-undeca-fluorohexyl)oxy]carbonyl}amino)-cyclohexyl]methyl} carbamate | 1-Isocyanato-3,3,5-trimethyl-5-isocyanatomethyl-cyclohexane (IPDI) 4.05 g | 2,2,3,3,4,4,5,5,6,6,6-Undecafluorohexan-1-ol 10.9 g | Desmorapid Z 0.02 g | 70° C. | colourless solid | 1.4014 (C) |
| 42 | 2,2,3,3,4,4,5,5,6,6,6-Undecafluorohexyl hexylcarbamate | n-Hexyl isocyanate 4.46 g | 2,2,3,3,4,4,5,5,6,6,6-Undecafluorohexan-1-ol 10.5 g | Desmorapid Z 0.02 g | 70° C. | colourless liquid | 1.3640 (B) |
| 43 | Bis(2,2,3,3,4,4,5,5,6,6,6-undecafluorohexyl)-(4-methylcyclohexane-1,3-diyl) biscarbamate | Hexahydrotolylene diisocyanate (H6TDI) 3.46 g | 2,2,3,3,4,4,5,5,6,6,6-Undecafluorohexan-1-ol 11.5 g | Desmorapid Z 0.02 g | 70° C. | colourless solid | 1.3916 (C) |
| 44 | 2,2,3,3,4,4,5,5,6,6,6-Undecafluorohexyl propan-2-ylcarbamate | Isopropyl isocyanate 3.31 g | 2,2,3,3,4,4,5,5,6,6,6-Undecafluorohexan-1-ol 11.7 g | Desmorapid Z 0.02 g | 70° C. | colourless solid | 1.3706 (C) |
| 45 | 2,2,3,3,4,4,5,5,6,6,6-Undecafluorohexyl cyclohexylcarbamate | Cyclohexyl isocyanate 4.41 g | 2,2,3,3,4,4,5,5,6,6,6-Undecafluorohexan-1-ol 10.6 g | Desmorapid Z 0.02 g | 70° C. | colourless solid | 1.3956 (C) |
| 46 | 2,2,3,3,4,4,5,5,6,6,7,7-Dodecafluoroheptyl butylcarbamate | n-Butyl isocyanate 3.44 g | 2,2,3,3,4,4,5,5,6,6,7,7-Dodecafluoroheptan-1-ol 11.5 g | Desmorapid Z 0.02 g | 70° C. | colourless liquid | 1.3627 (B) |
| 47 | Bis(2,2,3,3,4,4,5,5,6,6,7,7-dodecafluoroheptyl)-{4-[({[(2,2,3,3,4,4,5,5,6,6,7,7-dodecafluoroheptyl)-oxy]carbonyl}amino)methyl]octane-1,8-diyl} biscarbamate | 1,8-Diisocyanato-4-(isocyanato-methyl)octane (TIN) 3.03 g | 2,2,3,3,4,4,5,5,6,6,7,7-Dodecafluoroheptan-1-ol 11.9 g | Desmorapid Z 0.02 g | 70° C. | colourless liquid | 1.3807 (B) |
| 48 | Bis(2,2,3,3,4,4,5,5,6,6,7,7-dodecafluoroheptyl)-(2,2,4-trimethylhexane-1,6-diyl) biscarbamate | 2,4,4-Trimethylhexane 1,6-diisocyanate (TMDI) 3.60 g | 2,2,3,3,4,4,5,5,6,6,7,7-Dodecafluoroheptan-1-ol 11.4 g | Desmorapid Z 0.02 g | 70° C. | colourless oil | 1.3839 (B) |
| 49 | Bis(2,2,3,3,4,4,5,5,6,6,7,7-dodecafluoroheptyl) hexane-1,6-diylbiscarbamate | 6-Diisocyanato-hexane (HDI) 3.03 g | 2,2,3,3,4,4,5,5,6,6,7,7-Dodecafluoroheptan-1-ol 11.9 g | Desmorapid Z 0.02 g | 70° C. | colourless solid | 1.3944 (C) |
| 50 | Bis(2,2,3,3,4,4,5,5,6,6,7,7-dodecafluoroheptyl) (methanediyldicyclohexane-4,1-diyl) biscarbamate | Dicyclohexyl-methane diisocyanate (Desmodur W) 4.24 g | 2,2,3,3,4,4,5,5,6,6,7,7-Dodecafluoroheptan-1-ol 10.8 g | Desmorapid Z 0.02 g | 70° C. | colourless solid | 1.4160 (A) |
| 51 | 2,2,3,3,4,4,5,5,6,6,7,7-Dodecafluoroheptyl-{3-[({[(2,2,3,3,4,4,5,5,6,6,7,7-dodecafluoroheptyl)oxy]carbonyl}-amino)methyl]-3,5,5-trimethylcyclohexyl}carbamate | 1-Isocyanato-3,3,5-trimethyl-5-isocyanatomethyl-cyclohexane (IPDI) 3.75 g | 2,2,3,3,4,4,5,5,6,6,7,7-Dodecafluoroheptan-1-ol 11.2 g | Desmorapid Z 0.02 g | 70° C. | colourless liquid | 1.4080 (A) |
| 52 | 2,2,3,3,4,4,5,5,6,6,7,7-Dodecafluoroheptyl hexylcarbamate | n-Hexyl isocyanate 4.15 g | 2,2,3,3,4,4,5,5,6,6,7,7-Dodecafluoroheptan-1-ol 10.8 g | Desmorapid Z 0.02 g | 70° C. | colourless liquid | 1.3716 (B) |
| 53 | Bis(2,2,3,3,4,4,5,5,6,6,7,7-dodecafluoroheptyl)-(4- | Hexahydrotolylene diisocyanate | 2,2,3,3,4,4,5,5,6,6,7,7-Dodecafluoro | Desmorapid Z 0.02 g | 70° C. | colourless solid | 1.4020 (A) |

TABLE 1-continued

Preparation and characterization of Examples 2-224

| Example | Name | Isocyanate and amount | Alcohol and amount | Catalyst and amount | Temp [°C.] | Description | Refractive index (Method) |
|---|---|---|---|---|---|---|---|
| | methylcyclohexane-1,3-diyl) biscarbamate | (H6TDI) 3.20 g | 1-ol 11.8 g | | | | |
| 54 | 2,2,3,3,4,4,5,5,6,6,7,7-Dodecafluoroheptyl propan-2-ylcarbamate | Isopropyl isocyanate 3.06 g | 2,2,3,3,4,4,5,5,6,6,7,7-Dodecafluoroheptan-1-ol 11.93 g | Desmorapid Z 0.02 g | 70° C. | colourless liquid | 1.3563 (B) |
| 55 | 2,2,3,3,4,4,5,5,6,6,7,7-Dodecafluoroheptyl cyclohexylcarbamate | Cyclohexyl isocyanate 4.10 g | 2,2,3,3,4,4,5,5,6,6,7,7-Dodecafluoroheptan-1-ol 10.9 g | Desmorapid Z 0.02 g | 70° C. | colourless liquid | 1.3830 (B) |
| 56 | 2,2,3,3,4,4,5,5,6,6,7,7,8,8,8-Pentadecafluorooctyl butylcarbamate | n-Butyl isocyanate 2.97 g | 2,2,3,3,4,4,5,5,6,6,7,7,8,8,8-Pentadecafluorooctan-1-ol 12.0 g | Desmorapid Z 0.02 g | 70° C. | colourless liquid | 1.3488 (B) |
| 57 | Bis(2,2,3,3,4,4,5,5,6,6,7,7,8,8,8-pentadecafluorooctyl)-{4-[({[(2,2,3,3,4,4,5,5,6,6,7,7,8,8,8-pentadecafluorooctyl)oxy]carbonyl}-amino)methyl]octane-1,8-diyl} biscarbamate | 1,8-Diisocyanato-4-(isocyanato-methyl)octane (TIN) 2.60 g | 2,2,3,3,4,4,5,5,6,6,7,7,8,8,8-Pentadecafluorooctan-1-ol 12.4 g | Desmorapid Z 0.02 g | 70° C. | colourless oil | n.d. |
| 58 | Bis(2,2,3,3,4,4,5,5,6,6,7,7,8,8,8-pentadecafluorooctyl)-(2,2,4-trimethylhexane-1,6-diyl) biscarbamate | 2,4,4-Trimethylhexane 1,6-diisocyanate (TMDI) 3.12 g | 2,2,3,3,4,4,5,5,6,6,7,7,8,8,8-Pentadecafluorooctan-1-ol 11.9 g | Desmorapid Z 0.02 g | 70° C. | colourless oil | 1.3798 (B) |
| 59 | Bis(2,2,3,3,4,4,5,5,6,6,7,7,8,8,8-pentadecafluorooctyl) hexane-1,6-diylbiscarbamate | 6-Diisocyanato-hexane (HDI) 2.60 g | 2,2,3,3,4,4,5,5,6,6,7,7,8,8,8-Pentadecafluorooctan-1-ol 12.4 g | Desmorapid Z 0.02 g | 70° C. | colourless solid | n.d. |
| 60 | Bis(2,2,3,3,4,4,5,5,6,6,7,7,8,8,8-pentadecafluorooctyl) (methanediyldicyclohexane-4,1-diyl) biscarbamate | Dicyclohexyl-methane diisocyanate (Desmodur W) 3.70 g | 2,2,3,3,4,4,5,5,6,6,7,7,8,8,8-Pentadecafluorooctan-1-ol 11.3 g | Desmorapid Z 0.02 g | 70° C. | colourless solid | n.d. |
| 61 | 2,2,3,3,4,4,5,5,6,6,7,7,8,8,8-Pentadecafluorooctyl-{[1,3,3-trimethyl-5-({[(2,2,3,3,4,4,5,5,6,6,7-7,8,8,8-pentadecafluorooctyl)oxy]carbonyl}-amino)cyclohexyl]methyl}carbamate | 1-Isocyanate-3,3,5-trimethyl-5-isocyanatomethyl-cyclohexane (IPDI) 3.25 g | 2,2,3,3,4,4,5,5,6,6,7,7,8,8,8-Pentadecafluorooctan-1-ol 11.7 g | Desmorapid Z 0.02 g | 70° C. | colourless liquid | 1.3747 (B) |
| 62 | 2,2,3,3,4,4,5,5,6,6,7,7,8,8,8-Pentadecafluorooctyl hexylcarbamate | n-Hexyl isocyanate 3.61 g | 2,2,3,3,4,4,5,5,6,6,7,7,8,8,8-Pentadecafluorooctan-1-ol 11.4 g | Desmorapid Z 0.02 g | 70° C. | colourless liquid | 1.3595 (B) |
| 63 | Bis(2,2,3,3,4,4,5,5,6,6,7,7,8,8,8-pentadecafluorooctyl)-(4-methylcyclohexane-1,3-diyl) biscarbamate | Hexahydrotolylene diisocyanate (H6TDI) 2.75 g | 2,2,3,3,4,4,5,5,6,6,7,7,8,8,8-Pentadecafluorooctan-1-ol 12.2 g | Desmorapid Z 0.02 g | 70° C. | colourless solid | 1.3900 (C) |
| 64 | 2,2,3,3,4,4,5,5,6,6,7,7,8,8,8-Pentadecafluorooctyl propan-2-ylcarbamate | Isopropyl isocyanate 2.63 g | 2,2,3,3,4,4,5,5,6,6,7,7,8,8,8-Pentadecafluorooctan-1-ol 12.4 g | Desmorapid Z 0.02 g | 70° C. | colourless solid | 1.4550 (A) |
| 65 | 2,2,3,3,4,4,5,5,6,6,7,7,8,8,8-Pentadecafluorooctyl cyclohexylcarbamate | Cyclohexyl isocyanate 3.57 g | 2,2,3,3,4,4,5,5,6,6,7,7,8,8,8-Pentadecafluorooctan-1-ol 11.4 g | Desmorapid Z 0.02 g | 70° C. | colourless solid | n.d. |
| 66 | 2,2,3,4,4,4-Hexafluorobutyl butylcarbamate | n-Butyl isocyanate 5.28 g | 2,2,3,4,4,4-Hexafluorobutan-1-ol 9.71 g | Desmorapid Z 0.02 g | 70° C. | colourless liquid | 1.3775 (B) |
| 67 | Bis(2,2,3,4,4,4-hexafluorobutyl)-[4-({[(2,2,3,4,4,4-hexafluorobutoxy)carbonyl]-amino}methyl)octane-1,8-diyl] biscarbamate | 1,8-Diisocyanato-4-(isocyanato-methyl)octane (TIN) 4.73 g | 2,2,3,4,4,4-Hexafluorobutan-1-ol 10.3 g | Desmorapid Z 0.02 g | 70° C. | colourless oil | 1.4180 (A) |
| 68 | Bis(2,2,3,4,4,4-hexafluorobutyl)-(2,2,4-trimethylhexane-1,6-diyl) biscarbamate | 2,4,4-Trimethylhexane 1,6-diisocyanate (TMDI) 5.48 g | 2,2,3,4,4,4-Hexafluorobutan-1-ol 9.50 g | Desmorapid Z 0.02 g | 70° C. | colourless oil | 1.4250 (A) |
| 69 | Bis(2,2,3,4,4,4-hexafluorobutyl) hexane-1,6-diylbiscarbamate | 6-Diisocyanato-hexane (HDI) 4.73 g | 2,2,3,4,4,4-Hexafluorobutan-1-ol 10.3 g | Desmorapid Z 0.02 g | 70° C. | colourless solid | 1.4760 (A) |
| 70 | Bis(2,2,3,4,4,4-hexafluorobutyl) (methanediyldicyclohexane-4,1-diyl) | Dicyclohexyl-methane | 2,2,3,4,4,4-Hexafluorobutan-1-ol | Desmorapid Z 0.02 g | 70° C. | colourless solid | 1.4324 (C) |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
| | biscarbamate | diisocyanate (Desmodur W) 8.27 g | | | | | |
| 71 | 2,2,3,4,4,4-Hexafluorobutyl-[3-({[(2,2,3,4,4,4-hexafluorobutoxy)carbonyl]amino}-methyl)-3,5,5-trimethylcyclohexyl] carbamate | 1-Isocyanato-3,3,5-trimethyl-5-isocyanatomethyl-cyclohexane (IPDI) 5.67 g | 2,2,3,4,4,4-Hexafluorobutan-1-ol 9.31 g | Desmorapid Z 0.02 g | 70° C. | colourless oil | 1.4300 (A) |
| 72 | 2,2,3,4,4,4-Hexafluorobutyl hexylcarbamate | n-Hexyl isocyanate 6.16 g | 2,2,3,4,4,4-Hexafluorobutan-1-ol 8.83 g | Desmorapid Z 0.02 g | 70° C. | colourless liquid | 1.3876 (B) |
| 73 | Bis(2,2,3,4,4,4-hexafluorobutyl)-(4-methylcyclohexane-1,3-diyl) biscarbamate | Hexahydrotolylene diisocyanate (H6TDI) 4.96 g | 2,2,3,4,4,4-Hexafluorobutan-1-ol 10.0 g | Desmorapid Z 0.02 g | 70° C. | colourless solid | 1.4350 (A) |
| 74 | 2,2,3,4,4,4-Hexafluorobutyl propan-2-ylcarbamate | Isopropyl isocyanate 4.77 g | 2,2,3,4,4,4-Hexafluorobutan-1-ol 10.2 g | Desmorapid Z 0.02 g | 70° C. | colourless oil | 1.3810 (A) |
| 75 | 2,2,3,4,4,4-Hexafluorobutyl cyclohexylcarbamate | Cyclohexyl isocyanate 6.10 g | 2,2,3,4,4,4-Hexafluorobutan-1-ol 8.88 g | Desmorapid Z 0.02 g | 70° C. | colourless solid | 1.4220 (A) |
| 76 | 2,2,3,3,4,4,5,5-Octafluoropentyl butylcarbamate | n-Butyl isocyanate 4.48 g | 2,2,3,3,4,4,5,5-Octafluoropentan-1-ol 10.5 g | Desmorapid Z 0.02 g | 70° C. | colourless liquid | 1.3731 (B) |
| 77 | Bis(2,2,3,3,4,4,5,5-octafluoropentyl)-{4-[({[(2,2,3,3,4,4,5,5-octafluoropentyl)-oxy]carbonyl}amino)methyl]octane-1,8-diyl} biscarbamate | 1,8-Diisocyanato-4-(isocyanatomethyl)-octane (TIN) 3.98 g | 2,2,3,3,4,4,5,5-Octafluoropentan-1-ol 11.0 g | Desmorapid Z 0.02 g | 70° C. | colourless oil | 1.4100 (A) |
| 78 | Bis(2,2,3,3,4,4,5,5-octafluoropentyl)-(2,2,4-trimethylhexane-1,6-diyl) biscarbamate | 2,4,4-Trimethylhexane 1,6-diisocyanate (TMDI) 4.67 g | 2,2,3,3,4,4,5,5-Octafluoropentan-1-ol 10.3 g | Desmorapid Z 0.02 g | 70° C. | colourless oil | 1.4160 (A) |
| 79 | Bis(2,2,3,3,4,4,5,5-octafluoropentyl) hexane-1,6-diylbiscarbamate | 6-Diisocyanato-hexane (HDI) 3.98 g | 2,2,3,3,4,4,5,5-Octafluoropentan-1-ol 11.0 g | Desmorapid Z 0.02 g | 70° C. | colourless solid | 1.4026 (C) |
| 80 | Bis(2,2,3,3,4,4,5,5-octafluoropentyl) (methanediyldicyclohexane-4,1-diyl) biscarbamate | Dicyclohexyl-methane diisocyanate (Desmodur W) 5.41 g | 2,2,3,3,4,4,5,5-Octafluoropentan-1-ol 9.58 g | Desmorapid Z 0.02 g | 70° C. | colourless solid | 1.4350 (A) |
| 81 | 2,2,3,3,4,4,5,5-Octafluoropentyl-{[1,3,3-trimethyl-5-({[(2,2,3,3,4,4,5,5-octafluoropentyl)oxy]carbonyl}-amino)cyclohexyl]methyl} carbamate | 1-Isocyanato-3,3,5-trimethyl-5-isocyanatomethyl-cyclohexane (IPDI) 4.85 g | 2,2,3,3,4,4,5,5-Octafluoropentan-1-ol 10.1 g | Desmorapid Z 0.02 g | 70° C. | colourless oil | 1.4230 (A) |
| 82 | 2,2,3,3,4,4,5,5-Octafluoropentyl hexylcarbamate | n-Hexyl isocyanate 5.30 g | 2,2,3,3,4,4,5,5-Octafluoropentan-1-ol 9.69 g | Desmorapid Z 0.02 g | 70° C. | colourless liquid | 1.3823 (B) |
| 83 | Bis(2,2,3,3,4,4,5,5-octafluoropentyl) (4-methylcyclohexane-1,3-diyl) biscarbamate | Hexahydrotolylene diisocyanate (H6TDI) 4.19 g | 2,2,3,3,4,4,5,5-Octafluoropentan-1-ol 10.8 g | Desmorapid Z 0.02 g | 70° C. | colourless oil | 1.4120 (A) |
| 84 | 2,2,3,3,4,4,5,5-Octafluoropentyl propan-2-ylcarbamate | Isopropyl isocyanate 4.02 g | 2,2,3,3,4,4,5,5-Octafluoropentan-1-ol 10.9 g | Desmorapid Z 0.02 g | 70° C. | colourless liquid | 1.3654 (B) |
| 85 | 2,2,3,3,4,4,5,5-Octafluoropentyl cyclohexylcarbamate | Cyclohexyl isocyanate 5.25 g | 2,2,3,3,4,4,5,5-Octafluoropentan-1-ol 9.73 g | Desmorapid Z 0.02 g | 70° C. | colourless liquid | 1.3977 (B) |
| 86 | 2,2,3,3,4,4,5,5,6,6,7,7,7-Tridecafluoroheptyl butylcarbamate | n-Butyl isocyanate 3.30 g | 2,2,3,3,4,4,5,5,6,6,7,7,7-Tridecafluoroheptan-1-ol 11.7 g | Desmorapid Z 0.02 g | 70° C. | colourless liquid | 1.3507 (B) |
| 87 | Bis(2,2,3,3,4,4,5,5,6,6,7,7,7-tridecafluoroheptyl)-{4-[({[(2,2,3,3,4,4,5,5,6,6,7,7,7-tridecafluoroheptyl)oxy]carbonyl}-amino)methyl]octane-1,8-diyl} biscarbamate | 1,8-Diisocyanato-4-(isocyanato-methyl)octane (TIN) 2.90 g | 2,2,3,3,4,4,5,5,6,6,7,7,7-Tridecafluoroheptan-1-ol 12.1 g | Desmorapid Z 0.02 g | 70° C. | colourless oil | 1.3858 (C) |
| 88 | Bis(2,2,3,3,4,4,5,5,6,6,7,7,7-tridecafluoroheptyl)-(2,2,4-trimethylhexane-1,6-diyl) | 2,4,4-Trimethylhexane 1,6-diisocyanate | 2,2,3,3,4,4,5,5,6,6,7,7,7-Tridecafluoroheptan-1- | Desmorapid Z 0.02 g | 70° C. | colourless oil | 1.3700 (B) |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
| | biscarbamate | (TMDI) 3.45 g | 1-ol 11.5 g | | | | |
| 89 | Bis(2,2,3,3,4,4,5,5,6,6,7,7,7-tridecafluoroheptyl) hexane-1,6-diylbiscarbamate | 6-Diisocyanato-hexane (HDI) 2.90 g | 2,2,3,3,4,4,5,5,6,6,7,7,7-Tridecafluoroheptan-1-ol 12.1 g | Desmorapid Z 0.02 g | 70° C. | colourless solid | 1.4002 (C) |
| 90 | Bis(2,2,3,3,4,4,5,5,6,6,7,7,7-tridecafluoroheptyl) (methane-diyldicyclohexane-4,1-diyl) biscarbamate | Dicyclohexyl-methane diisocyanate (Desmodur W) 4.08 g | 2,2,3,3,4,4,5,5,6,6,7,7,7-Tridecafluoroheptan-1-ol 10.9 g | Desmorapid Z 0.02 g | 70° C. | colourless solid | 1.3976 (C) |
| 91 | 2,2,3,3,4,4,5,5,6,6,7,7,7-Tridecafluoroheptyl-{[1,3,3-trimethyl-5-({[(2,2,3,3,4,4,5,5,6,6,7,7,7-tridecafluoroheptyl)oxy]carbonyl}-amino)cyclohexyl]methyl} carbamate | 1-Isocyanato-3,3,5-trimethyl-5-isocyanatomethyl-cyclohexane (IPDI) 3.60 g | 2,2,3,3,4,4,5,5,6,6,7,7,7-Tridecafluoroheptan-1-ol 11.4 g | Desmorapid Z 0.02 g | 70° C. | colourless solid | 1.3894 (C) |
| 92 | 2,2,3,3,4,4,5,5,6,6,7,7,7-Tridecafluoroheptyl hexylcarbamate | n-Hexyl isocyanate 3.98 g | 2,2,3,3,4,4,5,5,6,6,7,7,7-Tridecafluoroheptan-1-ol 11.0 g | Desmorapid Z 0.02 g | 70° C. | colourless solid | 1.4058 (C) |
| 93 | Bis(2,2,3,3,4,4,5,5,6,6,7,7,7-tridecafluoroheptyl)-(4-methylcyclohexan-1,3-diyl)biscarbamate | Hexahydrotolylene diisocyanate (H6TDI) 3.07 g | 2,2,3,3,4,4,5,5,6,6,7,7,7-Tridecafluoroheptan-1-ol 11.9 g | Desmorapid Z 0.02 g | 70° C. | colourless solid | 1.4002 (C) |
| 94 | 2,2,3,3,4,4,5,5,6,6,7,7,7-Tridecafluoroheptyl propan-2-ylcarbamate | Isopropyl isocyanate 2.93 g | 2,2,3,3,4,4,5,5,6,6,7,7,7-Tridecafluoroheptan-1-ol 12.1 g | Desmorapid Z 0.02 g | 70° C. | colourless liquid | 1.3459 (B) |
| 95 | 2,2,3,3,4,4,5,5,6,6,7,7,7-Tridecafluoroheptyl cyclohexylcarbamate | Cyclohexyl isocyanate 3.95 g | 2,2,3,3,4,4,5,5,6,6,7,7,7-Tridecafluoroheptan-1-ol 11.0 g | Desmorapid Z 0.02 g | 70° C. | colourless solid | 1.3856 (C) |
| 96 | 2,2,3,3,4,4,5,5,6,6,7,7,8,8,9,9,10,10,11,11-Icosafluoroundecyl butylcarbamate | n-Butyl isocyanate 2.35 g | 2,2,3,3,4,4,5,5,6,6,7,7,8,8,9,9,10,10,11,11-Icosafluoroundecan-1-ol 12.6 | Desmorapid Z 0.02 g | 70° C. | colourless solid | 1.3700 (A) |
| 97 | Bis(2,2,3,3,4,4,5,5,6,6,7,7,8,8,9,9,10,10,11,11-icosafluoroundecyl)-{4-[({[(2,2,3,3,4,4,5,5,6,-7,7,8,8,9,9,10,10,11,11-icosafluoro-undecyl)oxy]carbonyl}-amino)methyl]octanel,8-diyl}biscarbamate | 1,8-Diisocyanato-4-(isocyanato-methyl)octane (TIN) 2.04 g | 2,2,3,3,4,4,5,5,6,6,7,7,8,8,9,9,10,10,11,11-Icosafluoroundecan-1-ol 12.9 g | Desmorapid Z 0.02 g | 70° C. | colourless solid | 1.3750 (A) |
| 98 | Bis(2,2,3,3,4,4,5,5,6,6,7,7,8,8,9,9,10,10,11,11-icosafluoroundecyl)-(2,2,4-trimethylhexane-1,6-diyl)biscarbamate | 2,4,4-Trimethylhexane 1,6-diisocyanate (TMDI) 2.46 g | 2,2,3,3,4,4,5,5,6,6,7,7,8,8,9,9,10,10,11,11-Icosafluoroundecan-1-ol 12.5 g | Desmorapid Z 0.02 g | 70° C. | colourless solid | 1.4000 (A) |
| 99 | Bis(2,2,3,3,4,4,5,5,6,6,7,7,8,8,9,9,10,10,11,11-icosafluoroundecyl) hexane-1,6-diylbiscarbamate | 6-Diisocyanatohexane (HDI) 2.04 g | 2,2,3,3,4,4,5,5,6,6,7,7,8,8,9,9,10,10,11,11-Icosafluoroundecan-1-ol 12.9 g | Desmorapid Z 0.02 g | 70° C. | colourless solid | n.d. |
| 100 | Bis(2,2,3,3,4,4,5,5,6,6,7,7,8,8,9,9,10,10,11,11-icosafluoroundecyl) (methanediyldicyclohexane-4,1-diyl) biscarbamate | Dicyclohexylmethane diisocyanate (Desmodur W) 2.96 g | 2,2,3,3,4,4,5,5,6,6,7,7,8,8,9,9,10,10,11,11-Icosafluoroundecan-1-ol 12.0 g | Desmorapid Z 0.02 g | 70° C. | colourless solid | 1.3930 (C) |
| 101 | 2,2,3,3,4,4,5,5,6,6,7,7,8,8,9,9,10,10,11,11-Icosafluoroundecyl-{3-[({[(2,2,3,3,4,4,5,5,6,6,7,7,8,8,9,9,10,10,11,11-icosafluoroundecyl)oxy]-carbonyl}amino)methyl]-3,5,5-trimethylcyclohexyl}carbamate | 1-Isocyanato-3,3,5-trimethyl-5-isocyanatomethyl-cyclohexane (IPDI) 2.58 g | 2,2,3,3,4,4,5,5,6,6,7,7,8,8,9,9,10,10,11,11-Icosafluoroundecan-1-ol 12.4 g | Desmorapid Z 0.02 g | 70° C. | colourless solid | 1.3950 (A) |
| 102 | 2,2,3,3,4,4,5,5,6,6,7,7,8,8,9,9,10,10,11,11-Icosafluoroundecyl | n-Hexyl isocyanate 2.88 g | 2,2,3,3,4,4,5,5,6,6,7,7,8,8,9,9,10,10,11,11- | Desmorapid Z 0.02 g | 70° C. | colourless solid | 1.3770 (C) |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
| | hexylcarbamate | | Icosafluoroundecan-1-ol 12.1 g | | | | |
| 103 | Bis(2,2,3,3,4,4,5,5,6,6,7,7,8,8,9,9,10,10,11,11-icosafluoroundecyl)-(4-methylcyclohexan-1,3-diyl)biscarbamate | Hexahydrotolylene diisocyanate (H6TDI) 2.17 g | 2,2,3,3,4,4,5,5,6,6,7,7,8,8,9,9,10,10,11,11-Icosafluoroundecan-1-ol 12.8 g | Desmorapid Z 0.02 g | 70° C. | colourless solid | 1.3890 (C) |
| 104 | 2,2,3,3,4,4,5,5,6,6,7,7,8,8,9,9,10,10,11,11-Icosafluoroundecyl propan-2-ylcarbamate | Isopropyl isocyanate 2.06 g | 2,2,3,3,4,4,5,5,6,6,7,7,8,8,9,9,10,10,11,11-Icosafluoroundecan-1-ol 12.9 g | Desmorapid Z 0.02 g | 70° C. | colourless solid | 1.3700 (A) |
| 105 | 2,2,3,3,4,4,5,5,6,6,7,7,8,8,9,9,10,10,11,11-Icosafluoroundecyl cyclohexylcarbamate | Cyclohexyl isocyanate 2.85 g | 2,2,3,3,4,4,5,5,6,6,7,7,8,8,9,9,10,10,11,11-Icosafluoroundecan-1-ol 12.1 g | Desmorapid Z 0.02 g | 70° C. | colourless solid | n.d. |
| 106 | 2,2,3,3,4,4,5,5,6,6,7,7,8,8,9,9,10,10,11,11,12,12,13,13-Tetracosafluorotridecyl butylcarbamate | n-Butyl isocyanate 2.03 g | 2,2,3,3,4,4,5,5,6,6,7,7,8,8,9,9,10,10,11,11,12,12,13,13-Tetracosa-fluorotridecan-1-ol 12.5 g | Desmorapid Z 0.02 g | 70° C. | colourless solid | 1.3796 (C) |
| 107 | Bis(2,2,3,3,4,4,5,5,6,6,7,7,8,8,9,9,10,10,11,11,12,12,13,13-tetracosafluorotridecyl)-{4-[({[(2,2,3,3,4,4,5,5,6,6,7,7,8,8,9,9,10,10,11,11,12,12,13,13-tetracosafluorotridecyl)-oxy]carbonyl}-amino)methyl]octane-1,8-diyl}biscarbamate | 1,8-Diisocyanato-4-(isocyanato-methyl)octane (TIN) 1.76 g | 2,2,3,3,4,4,5,5,6,6,7,7,8,8,9,9,10,10,11,11,12,12,13,13-Tetracosa-fluorotridecan-1-ol 13.2 g | Desmorapid Z 0.02 g | 70° C. | colourless solid | n.d. |
| 108 | Bis(2,2,3,3,4,4,5,5,6,6,7,7,8,8,9,9,10,10,11,11,12,12,13,13-tetracosafluorotridecyl)-(2,2,4-trimethylhexane-1,6-diyl)biscarbamate | 2,4,4-Trimethylhexane 1,6-diisocyanate (TMDI) 2.13 g | 2,2,3,3,4,4,5,5,6,6,7,7,8,8,9,9,10,10,11,11,12,12,13,13-Tetracosa-fluorotridecan-1-ol 12.8 g | Desmorapid Z 0.02 g | 70° C. | colourless solid | 1.3600 (A) |
| 109 | Bis(2,2,3,3,4,4,5,5,6,6,7,7,8,8,9,9,10,10,11,11,12,12,13,13-tetracosafluorotridecyl) hexane-1,6-diylbiscarbamate | 6-Diisocyanatohexane (HDI) 1.76 g | 2,2,3,3,4,4,5,5,6,6,7,7,8,8,9,9,10,10,11,11,12,12,13,13-Tetracosa-fluorotridecan-1-ol 13.2 g | Desmorapid Z 0.02 g | 70° C. | colourless solid | n.d. |
| 110 | Bis(2,2,3,3,4,4,5,5,6,6,7,7,8,8,9,9,10,10,11,11,12,12,13,13-tetracosafluorotridecyl)(methanediyldicyclohexan-4,1-diyl)biscarbamate | Dicyclohexyl-methane diisocyanate (Desmodur W) 2.57 g | 2,2,3,3,4,4,5,5,6,6,7,7,8,8,9,9,10,10,11,11,12,12,13,13-Tetracosa-fluorotridecan-1-ol 12.4 g | Desmorapid Z 0.02 g | 70° C. | colourless solid | n.d. |
| 111 | 2,2,3,3,4,4,5,5,6,6,7,7,8,8,9,9,10,10,11,11,12,12,13,13-Tetracosafluorotridecyl-{[1,3,3-trimethyl-5-({[(2,2,3,3,4,4,5,5,6,6,7,7,8,8,9,9,10,10,11,11,12,12,13,13-tetracosafluorotridecyl)-oxy]carbonyl}-amino)cyclohexyl]methyl}carbamate | 1-Isocyanato-3,3,5-trimethyl-5-isocyanatomethyl-cyclohexane (IPDI) 2.24 g | 2,2,3,3,4,4,5,5,6,6,7,7,8,8,9,9,10,10,11,11,12,12,13,13-Tetracosa-fluorotridecan-1-ol 12.8 g | Desmorapid Z 0.02 g | 70° C. | colourless solid | 1.3934 (C) |
| 112 | 2,2,3,3,4,4,5,5,6,6,7,7,8,8,9,9,10,10,11,11,12,12,13,13-Tetracosafluorotridecyl hexylcarbamate | n-Hexyl isocyanate 2.51 g | 2,2,3,3,4,4,5,5,6,6,7,7,8,8,9,9,10,10,11,11,12,12,13,13-Tetracosa-fluorotridecan-1-ol 12.5 g | Desmorapid Z 0.02 g | 70° C. | colourless solid | 1.3742 (C) |
| 113 | Bis(2,2,3,3,4,4,5,5,6,6,7,7,8,8,9,9,10,10,11,11,12,12,13,13-tetracosafluorotridecyl)-(4-methylcyclohexane-1,3-diyl)biscarbamate | Hexahydrotolylene diisocyanate (H6TDI) 1.86 g | 2,2,3,3,4,4,5,5,6,6,7,7,8,8,9,9,10,10,11,11,12,12,13,13-Tetracosa-fluorotridecan-1-ol 13.1 g | Desmorapid Z 0.02 g | 70° C. | colourless solid | n.d. |
| 114 | 2,2,3,3,4,4,5,5,6,6,7,7,8,8,9,9,10,10,11,11,12,12,13,13-Tetracosafluorotridecyl propane-2-ylcarbamate | Isopropyl isocyanate 1.78 g | 2,2,3,3,4,4,5,5,6,6,7,7,8,8,9,9,10,10,11,11,12,12,13,13-Tetracosa-fluorotridecan-1-ol 13.2 g | Desmorapid Z 0.02 g | 70° C. | colourless solid | 1.3716 (C) |
| 115 | 2,2,3,3,4,4,5,5,6,6,7,7,8,8,9,9,10,10,11,11,12,12,13,13-Tetracosafluorotridecyl | Cyclohexyl isocyanate 2.48 g | 2,2,3,3,4,4,5,5,6,6,7,7,8,8,9,9,10,10,11,11,12,12,13,13-Tetracosa- | Desmorapid Z 0.02 g | 70° C. | colourless solid | n.d. |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
| | cyclohexylcarbamate | | fluorotridecan-1-ol 12.5 g | | | | |
| 116 | Bis(2,2,3,3-tetrafluoropropyl)-[4-({[(2,2,3,3-tetrafluoropropoxy)carbonyl]amino}-methyl)octane-1,8-diyl]biscarbamate | 1,8-Diisocyanato-4-(isocyanatomethyl)octane (TIN) 5.83 g | 2,2,3,3-Tetrafluoro-1-propanol 9.16 g | Desmorapid Z 0.02 g | 70° C. | colourless oil | 1.4300 (A) |
| 117 | Bis(2,2,3,3-tetrafluoropropyl)-(2,2,4-trimethylhexane-1,6-diyl)biscarbamate | 2,4,4-Trimethylhexane-1,6-diisocyanate (TMDI) 6.64 g | 2,2,3,3-Tetrafluoro-1-propanol 8.35 g | Desmorapid Z 0.02 g | 70° C. | colourless liquid | 1.4320 (A) |
| 118 | Bis(2,2,2-trifluoroethyl) hexane-1,6-diylbiscarbamate | 6-Diisocyanato-hexane (HDI) 6.84 g | 1,1,1-Trifluoroethanol 8.14 g | Desmorapid Z 0.02 g | 70° C. | colourless solid | 1.4178 (C) |
| 119 | Bis(2,2,3,3-tetrafluoropropyl) hexane-1,6-diylbiscarbamate | 6-Diisocyanato-hexane (HDI) 5.83 g | 2,2,3,3-Tetrafluoro-1-propanol 9.16 g | Desmorapid Z 0.02 g | 70° C. | colourless solid | 1.4308 (C) |
| 120 | Bis(2,2,3,3,4,4,4-heptafluorobutyl) hexane-1,6-diylbiscarbamate | 6-Diisocyanato-hexane (HDI) 4.43 g | 2,2,3,3,4,4,4-Heptafluoro-1-butanol 10.6 g | Desmorapid Z 0.02 g | 70° C. | colourless solid | n.d. |
| 121 | Bis(2,2,3,3,4,4,5,5,6,6,7,7,8,8,9,9-hexadecafluorononyl) hexane-1,6-diylbiscarbamate | 6-Diisocyanato-hexane (HDI) 2.44 g | 2,2,3,3,4,4,5,5,6,6,7,7,8,8,9,9-Hexadeca-fluorononanol 12.5 g | Desmorapid Z 0.02 g | 70° C. | colourless solid | n.d. |
| 122 | Bis(2,2,2-trifluoroethyl)-(methanediyldicyclohexane-4,1-diyl)biscarbamate | Dicyclohexyl-methane diisocyanate (Desmodur W) 8.50 g | 2,2,2-Trifluoroethanol 6.49 g | Desmorapid Z 0.02 g | 70° C. | colourless solid | 1.4600 (A) |
| 123 | Bis(1,1,1,3,3,3-hexafluoropropan-2-yl) (methanediyldicyclohexane-4,1-diyl)biscarbamate | Dicyclohexyl-methane diisocyanate (Desmodur W) 6.57 g | 1,1,1,3,3,3-Hexa-fluoropropan-2-ol 8.42 g | Desmorapid Z 0.02 g | 70° C. | colourless solid | 1.4300 (A) |
| 124 | Bis(2,2,3,3-tetrafluoropropyl)-(methanediyldicyclohexane-4,1-diyl)biscarbamate | Dicyclohexyl-methane diisocyanate (Desmodur W) 7.46 g | 2,2,3,3-Tetra-fluoropropan-1-ol 7.52 g | Desmorapid Z 0.02 g | 70° C. | colourless solid | 1.4500 (A) |
| 125 | Bis(2,2,3,3,4,4,4-heptafluorobutyl)-(methanediyldicyclohexane-4,1-diyl)biscarbamate | Dicyclohexyl-methane diisocyanate (Desmodur W) 5.93 g | 2,2,3,3,4,4,4-Hepta-fluorobutan-1-ol 9.05 g | Desmorapid Z 0.02 g | 70° C. | colourless solid | 1.4312 (C) |
| 126 | Bis(2,2,3,3,4,4,5,5,6,6,7,7,8,8,9,9-hexadecafluorononyl)-(methanediyldicyclohexane-4,1-diyl)biscarbamate | Dicyclohexyl-methane diisocyanate (Desmodur W) 3.48 g | 2,2,3,3,4,4,5,5,6,6,7,7,8,8,9,9-Hexadeca-fluorononan-1-ol 11.5 g | Desmorapid Z 0.02 g | 70° C. | colourless solid | 1.4100 (A) |
| 127 | 2,2,2-Trifluoroethyl-[(1,3,3-trimethyl-5-{[(2,2,2-trifluoroethoxy)carbonyl]amino}-cyclohexyl)methyl]carbamate | 1-Isocyanato-3,3,5-trimethyl-5-isocyanatomethyl-cyclohexane (IPDI) 7.88 g | 2,2,2-Trifluoroethanol 7.10 g | Desmorapid Z 0.02 g | 70° C. | colourless oil | 1.4400 (A) |
| 128 | 1,1,1,3,3,3-Hexafluoropropan-2-yl-{3-[({[(1,1,1,3,3,3-hexafluoropropan-2-yl)oxy]carbonyl}amino)methyl]-3,5,5-trimethylcyclohexyl}carbamate | 1-Isocyanato-3,3,5-trimethyl-5-isocyanatomethyl-cyclohexane (IPDI) 5.96 g | 1,1,1,3,3,3-Hexa-fluoropropan-2-ol 9.02 g | Desmorapid Z 0.02 g | 70° C. | colourless solid | 1.4100 (A) |
| 129 | 2,2,3,3-Tetrafluoropropyl-[(1,3,3-trimethyl-5-{[(2,2,3,3-tetrafluoropropoxy)carbonyl]amino}-cyclohexyl)methyl]carbamate | 1-Isocyanato-3,3,5-trimethyl-5-isocyanatomethyl-cyclohexane (IPDI) 6.85 g | 2,2,3,3-Tetra-fluoropropan-1-ol 8.13 g | Desmorapid Z 0.02 g | 70° C. | colourless oil | 1.4394 (C) |
| 130 | 2,2,3,3,4,4,4-Heptafluorobutyl-[3-({[(2,2,3,3,4,4,4-heptafluorobutoxy)carbonyl]amino}-methyl)-3,5,5-trimethylcyclohexyl]carbamate | 1-Isocyanato-3,3,5-trimethyl-5-isocyanatomethyl-cyclohexane (IPDI) 5.35 g | 2,2,3,3,4,4,4-Hepta-fluorobutan-1-ol 9.63 g | Desmorapid Z 0.02 g | 70° C. | colourless solid | 1.4092 (C) |
| 131 | 2,2,3,3,4,4,5,5,6,6,7,7,8,8,9,9-Hexadecafluorononyl-{3-[({[(2,2,3,3,4,4,5,5,6,6,7,7,8,8,9,9-hexadecafluorononyl)oxy]carbonyl}-amino)methyl]-3,5,5- | 1-Isocyanato-3,3,5-trimethyl-5-isocyanatomethyl-cyclohexane (IPDI) 3.06 g | 2,2,3,3,4,4,5,5,6,6,7,7,8,8,9,9-Hexadeca-fluorononan-1-ol 11.9 g | Desmorapid Z 0.02 g | 70° C. | colourless solid | 1.4050 (A) |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
| | trimethylcyclohexyl}carbamate | | | | | | |
| 132 | 2,2,3,3,4,4,4-Heptafluorobutyl-hexylcarbamate | n-Hexyl isocyanate 5.82 g | 2,2,3,3,4,4,4-Hepta-fluorobutan-1-ol 9.16 g | Desmorapid Z 0.02 g | 70° C. | colourless liquid | 1.3745 (B) |
| 133 | 2,2,3,3,4,4,5,5,6,6,7,7,8,8,9,9-Hexadecafluorononyl hexylcarbamate | n-Hexyl isocyanate 3.40 g | 2,2,3,3,4,4,5,5,6,6,7,7,8,8,9,9-Hexadeca-fluorononan-1-ol 11.6 g | Desmorapid Z 0.02 g | 70° C. | colourless solid | 1.4030 (A) |
| 134 | Bis(2,2,2-trifluoroethyl)-(4-methylcyclohexane-1,3-diyl)biscarbamate | Hexahydrotolylene diisocyanate (H6TDI) 7.10 g | 2,2,2-Trifluoroethanol 7.88 g | Desmorapid Z 0.02 g | 70° C. | colourless solid | 1.4334 (C) |
| 135 | Bis(1,1,1,3,3,3-hexafluoropropan-2-yl)-(4-methylcyclohexane-1,3-diyl)biscarbamate | Hexahydrotolylene diisocyanate (H6TDI) 5.23 g | 1,1,1,3,3,3-Hexa-fluoropropan-2-ol 9.76 g | Desmorapid Z 0.02 g | 70° C. | colourless solid | 1.4032 (C) |
| 136 | Bis(2,2,3,3-tetrafluoropropyl)-(4-methylcyclohexane-1,3-diyl)biscarbamate | Hexahydrotolylene diisocyanate (H6TDI) 6.08 g | 2,2,3,3-Tetra-fluoropropan-1-ol 8.90 g | Desmorapid Z 0.02 g | 70° C. | colourless solid | 1.4340 (C) |
| 137 | Bis(2,2,3,3,4,4,4-heptafluorobutyl)-(4-methylcyclohexane-1,3-diyl)biscarbamate | Hexahydrotolylene diisocyanate (H6TDI) 4.65 g | 2,2,3,3,4,4,4-Hepta-fluorobutan-1-ol 11.3 g | Desmorapid Z 0.02 g | 70° C. | colourless solid | 1.4022 (C) |
| 138 | Bis(2,2,3,3,4,4,5,5,6,6,7,7,8,8,9,9-hexadecafluorononyl)-(4-methylcyclohexane-1,3-diyl)biscarbamate | Hexahydrotolylene diisocyanate (H6TDI) 2.58 g | 2,2,3,3,4,4,5,5,6,6,7,7,8,8,9,9-Hexadeca-fluorononan-1-ol 12.4 g | Desmorapid Z 0.02 g | 70° C. | colourless solid | 1.3878 (C) |
| 139 | 1,1,1,3,3,3-Hexafluoropropan-2-yl propan-2-ylcarbamate | Isopropylisocyanate 5.04 g | 1,1,1,3,3,3-Hexa-fluoropropan-2-ol 9.94 g | Desmorapid Z 0.02 g | 70° C. | yellow solid | 1.3542 (C) |
| 140 | 2,2,3,3-Tetrafluoropropyl propan-2-ylcarbamate | Isopropylisocyanate 5.87 g | 2,2,3,3-Tetra-fluoropropan-1-ol 9.11 g | Desmorapid Z 0.02 g | 70° C. | colourless liquid | 1.3831 (B) |
| 141 | 2,2,3,3,4,4,4-Heptafluorobutyl propan-2-ylcarbamate | Isopropylisocyanate 4.47 g | 2,2,3,3,4,4,4-Hepta-fluorobutan-1-ol 10.5 g | Desmorapid Z 0.02 g | 70° C. | colourless liquid | 1.3526 (B) |
| 142 | 2,2,3,3,4,4,5,5,6,6,7,7,8,8,9,9-Hexadecafluorononyl propan-2-ylcarbamate | Isopropylisocyanate 2.48 g | 2,2,3,3,4,4,5,5,6,6,7,7,8,8,9,9-Hexadeca-fluorononan-1-ol 12.5 g | Desmorapid Z 0.02 g | 70° C. | colourless oil | 1.3600 (A) |
| 143 | 2,2,2-Trifluoroethyl cyclohexylcarbamate | Cyclohexyliso-cyanate 8.33 g | 2,2,2-Trifluoroethanol 6.65 g | Desmorapid Z 0.02 g | 70° C. | colourless solid | 1.4256 (C) |
| 144 | 1,1,1,3,3,3-Hexafluoropropan-2-yl cyclohexylcarbamate | Cyclohexyliso-cyanate 6.40 g | 1,1,1,3,3,3-Hexa-fluoropropan-2-ol 8.58 g | Desmorapid Z 0.02 g | 70° C. | colourless solid | 1.4020 (C) |
| 145 | 2,2,3,3-Tetrafluoropropyl cyclohexylcarbamate | Cyclohexyl isocyanate 7.29 g | 2,2,3,3-Tetra-fluoropropan-1-ol 7.69 g | Desmorapid Z 0.02 g | 70° C. | colourless solid | 1.4296 (C) |
| 146 | 2,2,3,3,4,4,4-Heptafluorobutyl cyclohexylcarbamate | Cyclohexyl isocyanate 5.77 g | 2,2,3,3,4,4,4-Hepta-fluorobutan-1-ol 9.21 g | Desmorapid Z 0.02 g | 70° C. | colourless solid | n.d. |
| 147 | 2,2,3,3,4,4,5,5,6,6,7,7,8,8,9,9-Hexadecafluorononyl cyclohexylcarbamate | Cyclohexyl isocyanate 3.37 g | 2,2,3,3,4,4,5,5,6,6,7,7,8,8,9,9-Hexadeca-fluorononan-1-ol 11.6 g | Desmorapid Z 0.02 g | 70° C. | colourless solid | 1.3930 (A) |
| 148 | 2,2,3,3,4,4,5,5,6,6,7,7-Dodecafluorooctane-1,8-diyl-bis(butylcarbamate) | n-Butyl isocyanate 7.07 g | 2,2,3,3,4,4,5,5,6,6,7,7-Dodecafluorooctane-1,8-diol 10.9 g | Desmorapid Z 0.01 g | 60° C. | colourless solid | n.d. |
| 149 | 2,2,3,3,4,4,5,5,6,6,7,7-Dodecafluorooctane-1,8-diyl-bis(hexylcarbamate) | n-Hexyl isocyanate 6.18 g | 2,2,3,3,4,4,5,5,6,6,7,7-Dodecafluorooctane-1,8-diol 8.80 g | Desmorapid Z 0.02 g | 70° C. | colourless solid | 1.4000 (A) |
| 150 | 2,2,3,3,4,4,5,5,6,6,7,7-Dodecafluorooctane-1,8-diyl-bis(propan-2-ylcarbamate) | Isopropyl isocyanate 4.79 g | 2,2,3,3,4,4,5,5,6,6,7,7-Dodecafluorooctane-1,8-diol 10.2 g | Desmorapid Z 0.02 g | 70° C. | colourless solid | 1.4000 (A) |
| 151 | 2,2,3,3,4,4,5,5,6,6,7,7-Dodecafluorooctane-1,8-diyl-bis[(1-methylcyclohexyl)carbamate] | Cyclohexyl isocyanate 6.13 g | 2,2,3,3,4,4,5,5,6,6,7,7-Dodecafluorooctane-1,8-diol 8.85 g | Desmorapid Z 0.02 g | 70° C. | colourless solid | n.d. |
| 152 | 4,4,5,5,6,6,7,7,8,8,9,9,10,10,11,11, | n-Butyl isocyanate | 4,4,5,5,6,6,7,7,8,8,9,9, | Desmorapid Z | 70° C. | colourless | 1.4038 (C) |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
| | 11-Heptadecafluoroundecane-1,2-diyl-bis(butylcarbamate) | 4.28 g | 10,10,11,11,11-Hepta-decafluoro-1,2-undecanediol 10.7 g | 0.02 g | | solid | |
| 153 | 4,4,5,5,6,6,7,7,8,8,9,9,10,10,11,11,11-Heptadecafluoroundecane-1,2-diyl-bis(hexylcarbamate) | n-Hexyl isocyanate 5.08 g | 4,4,5,5,6,6,7,7,8,8,9,9,10,10,11,11,11-Hepta-decafluoro-1,2-undecanediol 9.90 g | Desmorapid Z 0.02 g | 70° C. | colourless solid | 1.3988 (C) |
| 154 | 4,4,5,5,6,6,7,7,8,8,9,9,10,10,11,11,11-Heptadecafluoroundecane-1,2-diyl-bis(propan-2-ylcarbamate) | Isopropyl isocyanate 3.84 g | 4,4,5,5,6,6,7,7,8,8,9,9,10,10,11,11,11-Hepta-decafluoro-1,2-undecanediol 11.1 g | Desmorapid Z 0.02 g | 70° C. | colourless solid | n.d. |
| 155 | 4,4,5,5,6,6,7,7,8,8,9,9,10,10,11,11,11-Heptadecafluoroundecane-1,2-diyl-bis(cyclohexylcarbamate) | Cyclohexyl isocyanate 5.04 g | 4,4,5,5,6,6,7,7,8,8,9,9,10,10,11,11,11-Heptadecafluoro-1,2-undecanediol 9.94 g | Desmorapid Z 0.02 g | 70° C. | colourless solid | n.d. |
| 156 | 2,2,3,3,4,4,5,5-Octafluorohexane-1,6-diyl-bis(butylcarbamate) | n-Butyl isocyanate 6.44 g | 2,2,3,3,4,4,5,5-Octa-fluorohexane-1,6-diol 8.54 g | Desmorapid Z 0.02 g | 70° C. | colourless solid | 1.4226 (C) |
| 157 | 2,2,3,3,4,4,5,5-Octafluorohexane-1,6-diyl-bis(hexylcarbamate) | n-Hexyl isocyanate 7.38 g | 2,2,3,3,4,4,5,5-Octa-fluorohexane-1,6-diol 7.60 g | Desmorapid Z 0.02 g | 70° C. | colourless solid | n.d. |
| 158 | 2,2,3,3,4,4,5,5-Octafluorohexane-1,6-diyl-bis(propan-2-ylcarbamate) | Isopropyl isocyanate 5.90 g | 2,2,3,3,4,4,5,5-Octa-fluorohexane-1,6-diol 9.08 g | Desmorapid Z 0.02 g | 70° C. | colourless solid | n.d. |
| 159 | 2,2,3,3,4,4,5,5-Octafluorohexane-1,6-diyl-bis(cyclohexylcarbamate) | Cyclohexyl isocyanate 7.32 g | 2,2,3,3,4,4,5,5-Octa-fluorohexane-1,6-diol 7.66 g | Desmorapid Z 0.02 g | 70° C. | colourless solid | n.d. |
| 160 | n-Butylcarbamate of Fluorlink E 10/H | n-Butyl isocyanate 1.86 g | Fluorlink E 10/H 13.1 g | Desmorapid Z 0.02 g | 70° C. | colourless liquid | 1.3469 (B) |
| 161 | n-Hexylcarbamate of Fluorlink E 10/H | n-Hexyl isocyanate 2.30 g | Fluorlink E 10/H 12.7 g | Desmorapid Z 0.02 g | 70° C. | colourless liquid | 1.3530 (B) |
| 162 | Isopropylcarbamate of Fluorlink E 10/H | Isopropyl isocyanate 1.62 g | Fluorlink E 10/H 13.4 g | Desmorapid Z 0.02 g | 70° C. | colourless liquid | 1.3450 (A) |
| 163 | Cyclohexylcarbamate of Fluorlink E 10/H | Cyclohexyl isocyanate 2.27 g | Fluorlink E 10/H 12.7 g | Desmorapid Z 0.02 g | 70° C. | colourless liquid | n.d. |
| 164 | 1,1,1,3,3,3-Hexafluoropropan-2-yl-butylcarbamate | n-Butylisocyanate 6.96 g | 1,1,1-Trifluoropropan-2-ol 8.02 g | Desmorapid Z 0.02 g | 70° C. | colourless liquid | 1.3912 (B) |
| 165 | Bis(1,1,1,3,3,3-hexafluoropropan-2-yl)-{4-[({[(1,1,1,3,3,3-hexafluoropropan-2-yl)oxy]-carbonyl}amino)methyl]octane-1,8-diyl}biscarbamate | 1,8-Diisocyanato-4-(isocyanatomethyl) octane (TIN) 6.36 g | 1,1,1-Trifluoropropan-2-ol 8.62 g | Desmorapid Z 0.02 g | 70° C. | colourless oil | 1.4322 (C) |
| 166 | Bis(1,1,1,3,3,3-hexafluoropropan-2-yl)-(2,2,4-trimethylhexan-1,6-diyl)biscarbamate | 2,4,4-Trimethylhexane-1,6-diisocyanate (TMDI) 7.18 g | 1,1,1-Trifluoropropan-2-ol 7.80 g | Desmorapid Z 0.02 g | 70° C. | colourless oil | 1.4262 (B) |
| 167 | Bis(1,1,1,3,3,3-hexafluoropropan-2-yl) hexane-1,6-diylbiscarbamate | 6-Diisocyanatohexane (HDI) 6.36 g | 1,1,1-Trifluoropropan-2-ol 8.62 g | Desmorapid Z 0.02 g | 70° C. | colourless solid | n.d. |
| 168 | Bis(1,1,1,3,3,3-hexafluoropropan-2-yl) (methanediyldicyclohexane-4,1-diyl)biscarbamate | Dicyclohexylmethane diisocyanate (Desmodur W) 8.01 g | 1,1,1-Trifluoropropan-2-ol 6.97 g | Desmorapid Z 0.02 g | 70° C. | colourless solid | n.d. |
| 169 | 1,1,1,3,3,3-Hexafluoropropan-2-yl-{3-[({[(1,1,1,3,3,3-hexafluoropropan-2-yl)oxy]carbonyl}amino)methyl]-3,5,5-trimethylcyclohexyl}carbamate | 1-Isocyanato-3,3,5-trimethyl-5-isocyanatomethyl-cyclohexane (IPDI) 7.39 g | 1,1,1-Trifluoropropan-2-ol 7.59 g | Desmorapid Z 0.02 g | 70° C. | colourless oil | 1.4360 (C) |
| 170 | 1,1,1,3,3,3-Hexafluoropropan-2-yl hexylcarbamate | n-Hexyl isocyanate 7.90 g | 1,1,1-Trifluoropropan-2-ol 7.08 g | Desmorapid Z 0.02 g | 70° C. | colourless liquid | 1.3996 (B) |
| 171 | Bis(1,1,1,3,3,3-hexafluoropropan-2-yl)-(4-methylcyclohexane-1,3-diyl)biscarbamate | Hexahydrotolylene diisocyanate (H6TDI) 6.62 g | 1,1,1-Trifluoropropan-2-ol 8.36 g | Desmorapid Z 0.02 g | 70° C. | colourless solid | n.d. |
| 172 | 1,1,1,3,3,3-Hexafluoropropan-2-yl propan-2-ylcarbamate | Isopropyl isocyanate 6.40 g | 1,1,1-Trifluoropropan-2-ol 8.58 g | Desmorapid Z 0.02 g | 70° C. | colourless solid | 1.3870 (C) |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
| 173 | 1,1,1,3,3,3-Hexafluoropropan-2-yl cyclohexylcarbamate | Cyclohexyl isocyanate 7.84 g | 1,1,1-Trifluoropropan-2-ol 7.14 g | Desmorapid Z 0.02 g | 70° C. | colourless solid | n.d. |
| 174 | 2-Ethylhexyl-2,2,2-trifluoroethyl-hexane-1,6-diylbiscarbamate | Desmodur LD 11.6 g | 2,2,2-Trifluoroethanol 3.35 g | Desmorapid Z 0.02 g | 70° C. | colourless solid | 1.4940 (A) |
| 175 | alpha-(6-{[(2,2,2-Trifluoroethoxy)carbonyl]-amino}hexyl)-omega-{[(2,2,2-trifluoroethoxy)-carbonyl]amino}poly[(2,4-dioxo-1,3-diazetidine-1,3-diyl)hexane-1,6-diyl] | Desmodur N3400 9.86 g | 2,2,2-Trifluoroethanol 5.12 g | Desmorapid Z 0.02 g | 70° C. | colourless solid | 1.4450 (A) |
| 176 | alpha-(6-{[(2,2,2-Trifluoroethoxy)carbonyl]amino}-hexyl)-omega-[2,4,6-trioxo-3,5-bis(6-{[(2,2,2-trifluoroethoxy)carbonyl]amino}hexyl)-1,3,5-triazinan-1-yl]poly{[2,4,6-trioxo-5-(6-{[(2,2,2-trifluoroethoxy)carbonyl]amino}-hexyl)-1,3,5-triazinane-1,3-diyl]hexane-1,6-diyl} | Desmodur N3600 9.68 g | 2,2,2-Trifluoroethanol 5.30 g | Desmorapid Z 0.02 g | 70° C. | colourless solid | 1.4584 (C) |
| 177 | alpha-(6-{[(2,2,2-Trifluoroethoxy)carbonyl]amino}-hexyl)-omega-{[(2,2,2-trifluoro-ethoxy)carbonyl]amino}poly({(6Z)-2,4-dioxo-6-[(6-{[(2,2,2-trifluoroethoxy)carbonyl]amino}-hexyl)imino]-1,3,5-oxadiazinane-3,5-diyl}hexane-1,6-diyl) | Desmodur N3900 9.64 g | 2,2,2-Trifluoroethanol 5.34 g | Desmorapid Z 0.02 g | 70° C. | colourless solid | 1.4200 (A) |
| 178 | alpha-(6-{[(2,2,2-Trifluoroethoxy)-carbonyl]amino}hexyl)-omega-{[(2,2,2-trifluoroethoxy)-carbonyl]amino}poly[(2,4,6-trioxo-1,3,5-oxadiazinane-3,5-diyl)hexane-1,6-diyl] | Baymicron OXA 10.1 g | 2,2,2-Trifluoroethanol 4.90 g | Desmorapid Z 0.02 g | 70° C. | colourless solid | 1.4562 (C) |
| 179 | Bis(2,2,2-trifluoroethyl)(cyclohexane-1,3-diyldimethanediyl)biscarbamate | 1,3-Bis-(isocyanatomethyl) cyclohexane 7.38 g | 2,2,2-Trifluoroethanol 7.60 g | Desmorapid Z 0.02 g | 70° C. | colourless solid | 1.4348 (C) |
| 180 | 2-Ethylhexyl hexafluoropropan-2-yl hexane-1,6-diylbiscarbamate | Desmodur LD 10.1 g | Hexafluoro-2-propanol 4.88 g | Desmorapid Z 0.02 g | 70° C. | colourless solid | 1.4250 (A) |
| 181 | alpha-(6-{[(Hexafluoropropan-2-yl)carbonyl]amino}hexyl)-omega-{[(hexafluoropropan-2-yl)-carbonyl]amino}poly[(2,4-dioxo-1,3-diazetidine-1,3-diyl)hexane-1,6-diyl] | Desmodur N3400 8.00 g | Hexafluoro-2-propanol 6.98 g | Desmorapid Z 0.02 g | 70° C. | colourless solid | 1.4400 (A) |
| 182 | alpha-(6-{[(Hexafluoropropan-2-yl)carbonyl]amino}hexyl)-omega-[2,4,6-trioxo-3,5-bis(6-{[(hexafluoropropan-2-yl)-carbonyl]amino}hexyl)-1,3,5-triazinan-1-yl]poly{[2,4,6-trioxo-5-(6-{[(hexafluoropropan-2-yl)carbonyl]amino}hexyl)-1,3,5-triazinane-1,3-diyl]hexane-1,6-diyl} | Desmodur N3600 7.80 g | Hexafluoro-2-propanol 7.18 g | Desmorapid Z 0.02 g | 70° C. | colourless solid | 1.4400 (A) |
| 183 | alpha-(6-{[(Hexafluoropropan-2-yl)carbonyl]amino}hexyl)-omega-{[(hexafluoropropan-2-yl)-carbonyl]amino}poly({(6Z)-2,4-dioxo-6-[(6-{[(hexafluoropropan-2-yl)carbonyl]amino}hexyl)imino]-1,3,5-oxadiazinane-3,5-diyl}hexane-1,6-diyl) | Desmodur N3900 7.76 g | Hexafluoro-2-propanol 7.22 g | Desmorapid Z 0.02 g | 70° C. | colourless solid | 1.4400 (A) |
| 184 | alpha-(6-{[(Hexafluoropropan-2-yl)-carbonyl]amino}hexyl)-omega-{[(hexafluoropropan-2-yl)-carbonyl]amino}poly[(2,4,6-trioxo-1,3,5-oxadiazinane-3,5-diyl)hexane-1,6-diyl] | Baymicron OXA 8.25 g | Hexafluoro-2-propanol 6.73 g | Desmorapid Z 0.02 g | 70° C. | colourless solid | 1.4400 (A) |
| 185 | Bis(1,1,1,3,3,3-hexafluoropropan-2-yl) (cyclohexane-1,3-diyldimethanediyl)biscarbamate | 1,3-Bis-(isocyanatomethyl)-cyclohexane 5.49 g | Hexafluoro-2-propanol 9.49 g | Desmorapid Z 0.02 g | 70° C. | colourless solid | 1.4100 (A) |
| 186 | 2-Ethylhexyl-2,2,3,3-tetrafluoropropylhexane-1,6- | Desmodur LD 10.9 g | Tetrafluoro-1-propanol 4.12 g | Desmorapid Z 0.02 g | 70° C. | colourless solid | 1.4468 (B) |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
| 187 | diylbiscarbamate alpha-(6-{[(2,2,3,3-Tetrafluoropropyl)carbonyl]-amino}hexyl)-omega-{[(2,2,3,3-tetrafluoropropyl)-carbonyl]amino}poly[(2,4-dioxo-1,3-diazetidine-1,3-diyl)hexane-1,6-diyl] | Desmodur N3400 8.89 g | Tetrafluoro-1-propanol 6.09 g | Desmorapid Z 0.02 g | 70° C. | colourless solid | 1.4544 (C) |
| 188 | alpha-(6-{[(2,2,3,3-Tetrafluoropropyl)carbonyl]amino}-hexyl)-omega-[2,4,6-trioxo-3,5-bis(6-{[(2,2,3,3-tetrafluoropropyl)carbonyl]amino}-hexyl)-1,3,5-triazinan-1-yl]poly{[2,4,6-trioxo-5-(6-{[(2,2,3,3-tetrafluoropropyl)carbonyl]amino}-hexyl)-1,3,5-triazinane-1,3-diyl]hexane-1,6-diyl} | Desmodur N3600 8.70 g | Tetrafluoro-1-propanol 6.28 g | Desmorapid Z 0.02 g | 70° C. | colourless solid | 1.4580 (C) |
| 189 | alpha-(6-{[(2,2,3,3-Tetrafluoropropyl)carbonyl]amino}-hexyl)-omega-{[(2,2,3,3-tetrafluoropropyl)-carbonyl]amino}poly({(6Z)-2,4-dioxo-6-[(6-{[(2,2,3,3-tetrafluoropropyl)carbonyl]amino}-hexyl)imino]-1,3,5-oxadiazinane-3,5-diyl}hexane-1,6-diyl) | Desmodur N3900 8.65 g | Tetrafluoro-1-propanol 6.33 g | Desmorapid Z 0.02 g | 70° C. | colourless solid | 1.4588 (C) |
| 190 | alpha-(6-{[(2,2,3,3-Tetrafluoropropyl)carbonyl]-amino}hexyl)-omega-{[(2,2,3,3-tetrafluoropropyl)-carbonyl]amino}poly[(2,4,6-trioxo-1,3,5-oxadiazinane-3,5-diyl)hexane-1,6-diyl] | Baymicron OXA 9.13 g | Tetrafluoro-1-propanol 5.85 g | Desmorapid Z 0.02 g | 70° C. | colourless solid | 1.4590 (C) |
| 191 | Bis(2,2,3,3-Tetrafluoropropyl)-(cyclohexane-1,3-diyldimethanediyl)biscarbamate | 1,3-Bis-(isocyanatomethyl)-cyclohexane 6.35 g | Tetrafluoro-1-propanol 8.63 g | Desmorapid Z 0.02 g | 70° C. | colourless solid | 1.4300 (A) |
| 192 | 2-Ethylhexyl-2,2,3,3,4,4,5,5,5-nonafluoropentylhexane-1,6-diylbiscarbamate | Desmodur LD 8.71 g | 2,2,3,3,4,4,5,5,5-Nonafluoropentan-1-ol 6.27 g | Desmorapid Z 0.02 g | 70° C. | colourless solid | 1.4200 (A) |
| 193 | alpha-(6-{[(2,2,3,3,4,4,5,5,5-nonafluoropentan-1-oxy)carbonyl]-amino}hexyl)-omega-{[(2,2,3,3,4,4,5,5,5-nonafluoropentan-1-oxy)carbonyl]amino}poly[(2,4-dioxo-1,3-diazetidine-1,3-diyl)hexane-1,6-diyl] | Desmodur N3400 6.52 g | 2,2,3,3,4,4,5,5,5-Nonafluoropentan-1-ol 8.46 g | Desmorapid Z 0.02 g | 70° C. | colourless solid | 1.4200 (A) |
| 194 | alpha-(6-{[(2,2,3,3,4,4,5,5,5-nonafluoropentan-1-oxy)carbonyl]-amino}hexyl)-omega-[2,4,6-trioxo-3,5-bis(6-{[(2,2,3,3,4,4,5,5,5-nonafluoropentan-1-oxy)carbonyl]-amino}hexyl)-1,3,5-triazinan-1-yl]poly{[2,4,6-trioxo-5-(6-{[(2,2,3,3,4,4,5,5,5-nonafluoropentan-1-oxy)carbonyl]amino}hexyl)-1,3,5-triazinane-1,3-diyl]hexane-1,6-diyl} | Desmodur N3600 6.32 g | 2,2,3,3,4,4,5,5,5-Nonafluoropentan-1-ol 8.66 g | Desmorapid Z 0.02 g | 70° C. | colourless solid | 1.4232 (C) |
| 195 | alpha-(6-{[(2,2,3,3,4,4,5,5,5-nonafluoropentan-1-oxy)carbonyl]-amino}hexyl)-omega-{[(2,2,3,3,4,4,5,5,5-nonafluoropentan-1-oxy)carbonyl]amino}poly({(6Z)-2,4-dioxo-6-[(6-{[(2,2,3,3,4,4,5,5,5-nonafluoropentan-1-oxy)carbonyl]-amino}hexyl)imino]-1,3,5-oxadiazinane-3,5-diyl}hexane-1,6-diyl) | Desmodur N3900 6.28 g | 2,2,3,3,4,4,5,5,5-Nonafluoropentan-1-ol 8.70 g | Desmorapid Z 0.02 g | 70° C. | colourless solid | 1.4195 (B) |
| 196 | alpha-(6-{[(2,2,3,3,4,4,5,5,5-nonafluoropentan-1-oxy)carbonyl]-amino}hexyl)-omega-{[(2,2,3,3,4,4,5,5,5- | Baymicron OXA 6.77 g | 2,2,3,3,4,4,5,5,5-Nonafluoropentan-1-ol 8.21 g | Desmorapid Z 0.02 g | 70° C. | colourless solid | 1.4216 (C) |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
| | nonafluoropentan-1-oxy)carbonyl]amino}poly[(2,4,6-trioxo-1,3,5-oxadiazinane-3,5-diyl)hexane-1,6-diyl] | | | | | | |
| 197 | Bis(2,2,3,3,4,4,5,5-nonafluoropentyl) (cyclohexane-1,3-diyldimethanediyl)biscarbamate | 1,3-Bis-(isocyanatomethyl)cyclohexane 4.19 g | 2,2,3,3,4,4,5,5-Nonafluoropentan-1-ol 10.8 g | Desmorapid Z 0.02 g | 70° C. | colourless solid | 1.4012 (C) |
| 198 | 2,2,3,3,4,4,5,5,6,6,7,7-Dodecafluoroheptyl-2-ethylhexyl hexane-1,6-diyl biscarbamate | Desmodur LD 7.66 g | 2,2,3,3,4,4,5,5,6,6,7,7-Dodecafluoroheptan-1-ol 7.32 g | Desmorapid Z 0.02 g | 70° C. | colourless solid | 1.4096 (B) |
| 199 | alpha-(6-{[(2,2,3,3,4,4,5,5,6,6,7,7-Dodecafluoroheptan-1-oxy)carbonyl]-amino}hexyl)-omega-{[(2,2,3,3,4,4,5,5,6,6,7,7-dodecafluoroheptan 1-oxy)-carbonyl]amino}poly[(2,4-dioxo-1,3-diazetidine-1,3-diyl)hexane-1,6-diyl] | Desmodur N3400 5.50 g | 2,2,3,3,4,4,5,5,6,6,7,7-Dodecafluoroheptan-1-ol 9.48 g | Desmorapid Z 0.02 g | 70° C. | colourless solid | 1.4126 (C) |
| 200 | alpha-(6-{[(2,2,3,3,4,4,5,5,6,6,7,7-Dodecafluoroheptan 1-oxy)carbonyl]-amino}hexyl)-omega-[2,4,6-trioxo-3,5-bis(6-{[(2,2,3,3,4,4,5,5,6,6,7,7-dodecafluoroheptan-1-oxy)carbonyl]amino}hexyl)-1,3,5-triazinan-1-yl]poly{[2,4,6-trioxo-5-(6-{[(2,2,3,3,4,4,5,5,6,6,7,7-dodecafluoroheptan-1-oxy)carbonyl]amino}hexyl)-1,3,5-triazinane-1,3-diyl]hexane-1,6-diyl} | Desmodur N3600 5.32 g | 2,2,3,3,4,4,5,5,6,6,7,7-Dodecafluoroheptan-1-ol 9.67 g | Desmorapid Z 0.02 g | 70° C. | colourless solid | 1.430 (A) |
| 201 | alpha-(6-{[(2,2,3,3,4,4,5,5,6,6,7,7-Dodecafluoroheptan-1-oxy)carbonyl]-amino}hexyl)-omega-{[(2,2,3,3,4,4,5,5,6,6,7,7-dodecafluoroheptan 1-oxy)-carbonyl]amino}poly({(6Z)-2,4-dioxo-6-[(6-{[(2,2,3,3,4,4,5,5,6,6,7,7-dodecafluoroheptan-1-oxy)carbonyl]-amino}hexyl)imino]-1,3,5-oxadiazinane-3,5-diyl}hexane-1,6-diyl) | Desmodur N3900 5.27 g | 2,2,3,3,4,4,5,5,6,6,7,7-Dodecafluoroheptan-1-ol 9.71 g | Desmorapid Z 0.02 g | 70° C. | colourless solid | 1.410 (A) |
| 202 | alpha-(6-{[(2,2,3,3,4,4,5,5,6,6,7,7-Dodecafluoroheptan 1-oxy)carbonyl]-amino}hexyl)-omega-{[(2,2,3,3,4,4,5,5,6,6,7,7-dodecafluoroheptan-1-oxy)-carbonyl]amino}poly[(2,4,6-trioxo-1,3,5-oxadiazinane-3,5-diyl)hexane-1,6-diyl] | Baymicron OXA 5.73 g | 2,2,3,3,4,4,5,5,6,6,7,7-Dodecafluoroheptan-1-ol 9.25 g | Desmorapid Z 0.02 g | 70° C. | colourless solid | 1.4100 (A) |
| 203 | Bis(2,2,3,3,4,4,5,5,6,6,7,7-dodecafluoroheptyl) (cyclohexane-1,3-diyldimethanediyl)biscarbamate | 1,3-Bis-(isocyanatomethyl)cyclohexane 3.39 g | 2,2,3,3,4,4,5,5,6,6,7,7-Dodecafluoroheptan-1-ol 11.6 g | Desmorapid Z 0.02 g | 70° C. | colourless solid | 1.4020 (A) |
| 204 | 2-Ethylhexyl-2,2,3,3,4,4,5,5,6,6,7,7,8,8-penta-decafluorooctylhexane-1,6-diyl biscarbamate | Desmodur LD 6.96 g | 2,2,3,3,4,4,5,5,6,6,7,7,8,8-Pentadecafluoro-octan-1-ol 8.02 g | Desmorapid Z 0.02 g | 70° C. | colourless solid | 1.4262 (C) |
| 205 | alpha-(6-{[(2,2,3,3,4,4,5,5,6,6,7,7,8,8-Pentadecafluorooctan-1-oxy)carbonyl]amino}hexyl)-omega-{[(12,2,3,3,4,4,5,5,6,6,7,7,8,8-pentadecafluorooctan-1-oxy)-carbonyl]amino}poly[(2,4-dioxo-1,3-diazetidine-1,3-diyl)hexane-1,6-diyl] | Desmodur N3400 4.87 g | 2,2,3,3,4,4,5,5,6,6,7,7,8,8-Pentadecafluoro-octan-1-ol 10.1 g | Desmorapid Z 0.02 g | 70° C. | colourless solid | 1.4032 (C) |
| 206 | alpha-(6-{[(2,2,3,3,4,4,5,5,6,6,7,7,8,8-Pentadecafluorooctan-1-oxy)carbonyl]amino}hexyl)-omega-[2,4,6-trioxo-3,5-bis(6-{[(2,2,3,3,4,4,5,5,6,6,7,7,8,8-pentadecafluorooctan-1-oxy)carbonyl]amino}hexyl)-1,3,5- | Desmodur N3600 4.70 g | 2,2,3,3,4,4,5,5,6,6,7,7,8,8-Pentadecafluoro-octan-1-ol 10.3 g | Desmorapid Z 0.02 g | 70° C. | colourless solid | 1.4074 (C) |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
|  | triazinan-1-yl]poly{[2,4,6-trioxo-5-(6-{[(12,2,3,3,4,4,5,5,6,6,7,7,8,8,8-pentadecafluorooctan-1-oxy)carbonyl]amino}hexyl)-1,3,5-triazinane-1,3-diyl]hexane-1,6-diyl} |  |  |  |  |  |  |
| 207 | alpha-(6-{[(2,2,3,3,4,4,5,5,6,6,7,7,8,8,8-Pentadecafluorooctan-1-oxy)carbonyl]amino}hexyl)-omega-{[(2,2,3,3,4,4,5,5,6,6,7,7,8,8,8-pentadecafluorooctan-1-oxy)-carbonyl]amino}poly({(6Z)-2,4-dioxo-6-[(6-{[(2,2,3,3,4,4,5,5,6,6,7,7,8,8,8-pentadecafluorooctan-1-oxy)-carbonyl]amino}hexyl)imino]-1,3,5-oxadiazinane-3,5-diyl}hexane-1,6-diyl) | Desmodur N3900 4.65 g | 2,2,3,3,4,4,5,5,6,6,7,7,8,8,8-Pentadecafluoro-octan-1-ol 10.3 g | Desmorapid Z 0.02 g | 70° C. | colourless solid | 1.4058 (C) |
| 208 | alpha-(6-{[(2,2,3,3,4,4,5,5,6,6,7,7,8,8,8-Pentadecafluorooctan-1-oxy)-carbonyl]amino}hexyl)-omega-{[(2,2,3,3,4,4,5,5,6,6,7,7,8,8,8-pentadecafluorooctan-1-oxy)-carbonyl]amino}poly[(2,4,6-trioxo-1,3,5-oxadiazinane-3,5-diyl)hexane-1,6-diyl] | Baymicron OXA 5.09 g | 2,2,3,3,4,4,5,5,6,6,7,7,8,8,8-Pentadecafluoro-octan-1-ol 9.89 g | Desmorapid Z 0.02 g | 70° C. | colourless solid | n.d. |
| 209 | Bis(2,2,3,3,4,4,5,5,6,6,7,7,8,8,8-pentadecafluorooctyl) (cyclohexane-1,3-diyldimethanediyl) biscarbamate | 1,3-Bis-(isocyanatomethyl)cyclohexane 2.93 g | 2,2,3,3,4,4,5,5,6,6,7,7,8,8,8-Pentadecafluoro-octan-1-ol 12.1 g | Desmorapid Z 0.02 g | 70° C. | colourless solid | 1.3862 (C) |
| 210 | Butyl (3,3,4,4,5,5,6,6,7,7,8,8,9,9,10,10,10-heptadecafluorodecyl)carbamate | 3,3,4,4,5,5,6,6,7,7,8,8,9,9,10,10,10-Heptadecafluorodecyl isocyanate 1.52 g | n-Butanol 0.23 g | Desmorapid Z 0.001 g | 70° C. |  | n.d. |
| 211 | Isopropyl (3,3,4,4,5,5,6,6,7,7,8,8,9,9,10,10,10-heptadecafluorodecyl)carbamate | 3,3,4,4,5,5,6,6,7,7,8,8,9,9,10,10,10-Heptadecafluorodecyl isocyanate 1.52 g | Isopropanol 0.23 g | Desmorapid Z 0.001 g | 70° C. |  | n.d. |
| 212 | 1,1,1,3,3,3-Hexafluoropropan-2-yl (3,3,4,4,5,5,6,6,7,7,8,8,9,9,10,10,10-heptadecafluorodecyl)carbamate | 3,3,4,4,5,5,6,6,7,7,8,8,9,9,10,10,10-Heptadecafluorodecyl isocyanate 1.12 g | Hexafluoro-2-propanol 0.38 g | Desmorapid Z 0.001 g | 70° C. |  | n.d. |
| 213 | 2,2,2-Trifluoroethyl phenylcarbamate | Phenyl isocyanate 81.5 g | Trifluoroethanol 68.4 g | Desmorapid Z 0.07 g | 60° C. | colourless solid | 1.4838 (C) |
| 214 | 1,1,1,3,3,3-Hexafluoropropan-2-yl phenylcarbamate | Phenyl isocyanate 8.29 g | Hexafluoro-2-propanol 11.7 g | Desmorapid Z 0.01 g | 60° C. | colourless solid | 1.4476 (C) |
| 215 | 1,1,1,3,3,3-Hexafluoropropan-2-yl-2,2,2-trifluoroethylhexane-1,6-diyl biscarbamate | 2,2,2-Trifluoroethyl (6-isocyanato-hexyl)carbamate 5.24 g | Hexafluoro-2-propanol 4.75 g | Desmorapid Z 0.01 g | 70° C. | colourless solid | 1.4280 (C) |
| 216 | 2,2,3,3-Tetrafluoropropyl-2,2,2-trifluoroethylhexane-1,6-diyl biscarbamate | 2,2,2-Trifluoroethyl (6-isocyanato-hexyl)carbamate 5.83 g | Tetrafluoro-1-propanol 4.16 g | Desmorapid Z 0.01 g | 70° C. | colourless solid | 1.4514 (C) |
| 217 | 2,2,3,3,4,4,5,5,5-Nonafluoropentyl-2,2,2-trifluoroethylhexane-1,6-diyl biscarbamate | 2,2,2-Trifluoroethyl (6-isocyanato-hexyl)carbamate 4.25 g | 2,2,3,3,4,4,5,5,5-Nonafluoropentan-1-ol 5.74 | Desmorapid Z 0.01 g | 70° C. | colourless solid | 1.4168 (C) |
| 218 | 2,2,3,3,4,4,5,5,6,6,7,7-Dodecafluoroheptyl-2,2,2-trifluoroethylhexane-1,6-diyl biscarbamate | 2,2,2-Trifluoroethyl (6-isocyanato-hexyl)carbamate 3.57 g | 2,2,3,3,4,4,5,5,6,6,7,7-Dodecafluoroheptan-1-ol 5.74 g | Desmorapid Z 0.01 g | 70° C. | colourless solid | 1.4172 (C) |
| 219 | 2,2,3,3,4,4,5,5,6,6,7,7,8,8,8-Pentadecafluorooctyl-2,2,2-trifluoroethylhexane-1,6-diyl biscarbamate | 2,2,2-Trifluoroethyl (6-isocyanato-hexyl)carbamate 3.16 g | 2,2,3,3,4,4,5,5,6,6,7,7,8,8,8-Pentadecafluoro-octan-1-ol 6.83 g | Desmorapid Z 0.01 g | 70° C. | colourless solid | n.d. |
| 220 | 2,2,3,3,4,4,5,5-Octafluoropentyl-2,2,2-trifluoroethylhexane-1,6-diyl biscarbamate | 2,2,3,3,4,4,5,5-Octafluoropentyl (6-isocyanato-hexyl)carbamate | Trifluoroethanol 2.31 g | Desmorapid Z 0.01 g | 70° C. | colourless solid | 1.4236 (C) |

TABLE 1-continued

Preparation and characterization of Examples 2-224

| Example | Name | Isocyanate and amount | Alcohol and amount | Catalyst and amount | Temp [° C.] | Description | Refractive index (Method) |
|---|---|---|---|---|---|---|---|
| 221 | 1,1,1,3,3,3-Hexafluoropropan-2-yl-2,2,3,3,4,4,5,5-octafluoropentylhexane-1,6-diyl biscarbamate | 7.68 g 2,2,3,3,4,4,5,5-Octafluoropentyl (6-isocyanato-hexyl)carbamate 6.64 g | Hexafluoro-2-propanol 3.35 g | Desmorapid Z 0.01 g | 70° C. | colourless oil | 1.4086 (C) |
| 222 | 2,2,3,3,4,4,5,5-Octafluoropentyl-2,2,3,3-tetrafluoropropylhexane-1,6-diyl biscarbamate | 2,2,3,3,4,4,5,5-Octafluoropentyl (6-isocyanato-hexyl)carbamate 7.15 g | Tetrafluoro-1-propanol 2.84 g | Desmorapid Z 0.01 g | 70° C. | colourless solid | 1.4256 (C) |
| 223 | 2,2,3,3,4,4,5,5,6,6,7,7-Dodecafluoroheptyl-2,2,3,3,4,4,5,5-octafluoropentylhexane-1,6-diyl biscarbamate | 2,2,3,3,4,4,5,5-Octafluoropentyl (6-isocyanato-hexyl)carbamate 5.00 g | 2,2,3,3,4,4,5,5,6,6,7,7-Dodecafluoroheptan-1-ol 4.99 g | Desmorapid Z 0.01 g | 70° C. | colourless oil | 1.4048 (C) |
| 224 | 2,2,3,3,4,4,5,5-Octafluoropentyl-2,2,3,3,4,4,5,5,6,6,7,7,8,8-pentadecafluorooctylhexane-1,6-diyl biscarbamate | 2,2,3,3,4,4,5,5-Octafluoropentyl (6-isocyanato-hexyl)carbamate 4.54 g | 2,2,3,3,4,4,5,5,6,6,7,7,8,8,8-Pentadecafluoro-octan-1-ol 5.45 g | Desmorapid Z 0.01 g | 70° C. | colourless solid | 1.3970 (C) |

Example 225

9,9,10,10,11,11,12,12,13,13,14,14,29,29,30,30,31,31,32,32,33,33,34,34-Tetracosafluoro-20,20,22-trimethyl-6,17,26-trioxo-7,16,27-trioxa-5,18,25-triazapentatriacontan-35-yl butylcarbamate 2,2,3,3,4,4,5,5,6,6,7,7-Dodecafluoro-1,8-octanediol was initially introduced into a 250 ml round-bottomed flask and 0.05 g of dibutyltin dilaurate (Desmorapid Z, Bayer MaterialScience AG, Leverkusen, Germany) was added and heated to 60° C. 18.7 g of n-butyl isocyanate were added in portions and stirring was effected for 3 h at 60° C. Thereafter, 19.9 g of 2,4,4-trimethylhexane 1,6-diisocyanate (TMDI) were added dropwise and the mixture was further kept at 60° C. until the isocyanate content had fallen below 0.1%. Thereafter, cooling was effected and the product was obtained as a colourless oil; the refractive index determined according to method B is $n_D^{20}=1.4131$.

Example 226

23-(8,8,9,9,10,10,11,11,12,12,13,13-Dodecafluoro-5,16-dioxo-6,15-dioxa-4,17-diazahenicos-1-yl)-9,9,10,10,11,11,12,12,13,13,14,14,29,29,30,30,31,31,32,32,33,33,34,34-tetracosafluoro-6,17,26-trioxo-7,16,27-trioxa-5,18,25-triaza-pentatriacontan-35-yl butylcarbamate 2,2,3,3,4,4,5,5,6,6,7,7-Dodecafluoro-1,8-octanediol was initially introduced into a 100 ml round-bottomed flask and 0.01 g of dibutyltin dilaurate (Desmorapid Z, Bayer MaterialScience AG, Leverkusen, Germany) was added and heated to 60° C. 3.63 g of n-butyl isocyanate were added in portions and stirring was effected for 3 h at 60° C. Thereafter, 3.08 g of 1,8-diisocyanato-4-(isocyanatomethyl)octane (TIN) were added dropwise and the mixture was further kept at 60° C. until the isocyanate content had fallen below 0.1%. Thereafter, cooling was effected and the product was obtained as a colourless oil; the refractive index determined according to method A is n=1.4200.

Production of the Media

For testing the optical properties, media were produced and optically measured as described below:

Preparation of the Polyol Component 0.18 g of tin octanoate, 374.8 g of ε-caprolactone and 374.8 g of a difunctional polytetrahydrofuran polyether polyol (equivalent weight 500 g/mol OH) were initially introduced in a 1 l flask and heated to 120° C. and kept at this temperature until the solids content (proportion of non-volatile constituents) was 99.5% by weight or more. Thereafter, cooling was effected and the product was obtained as a waxy solid.

Preparation of Urethane Acrylate 1: phosphorothioyltris(oxybenzene-4,1-diylcarbamoyloxyethane-2,1-diyl) trisacrylate 0.1 g of 2,6-di-tert-butyl-4-methylphenol, 0.05 g of dibutyltin dilaurate (Desmorapid Z, Bayer MaterialScience AG, Leverkusen, Germany) and 213.07 g of a 27% strength solution of tris(p-isocyanatophenyl)thiophosphate in ethyl acetate (Desmodur® RFE, product of Bayer MaterialScience AG, Leverkusen, Germany) were initially introduced into a 500 ml round-bottomed flask and heated to 60° C. Thereafter, 42.37 g of 2-hydroxyethyl acrylate were added dropwise and the mixture was further kept at 60° C. until the isocyanate content had fallen below 0.1%. Thereafter, cooling was effected and ethyl acetate was completely removed in vacuo. The product was obtained as a semicrystalline solid.

Preparation of Urethane Acrylate 2: 2-({[3-(methylsulphanyl)phenyl]carbamoyl}oxy)-propyl prop-2-enoate 0.05 g of 2,6-di-tert-butyl-4-methylphenol, 0.02 g of Desmorapid Z, 26.8 g of 3-(methylthio)phenyl isocyanate in 50 g of ethyl acetate were initially introduced into a 250 ml round-bottomed flask and heated to 60° C. Thereafter, 21.1 g of 2-hydroxypropyl acrylate were added dropwise and the mixture was further kept at 60° C. until the isocyanate content had fallen below 0.1%. Thereafter, the ethyl acetate was distilled off at 5 mbar and cooling was effected. The product was obtained as a light yellow liquid.

Medium 1:

3.82 g of the polyol component prepared as described above were mixed with 2.50 g of phosphorothioyltris(oxybenzene-4,1-diylcarbamoyloxyethane-2,1-diyl) trisacrylate (urethane acrylate 1), 2.50 g of 2,2,2-trifluoroethyl hexylcarbamate (Example 4), 0.10 g of CGI 909 (experimental product of Ciba Inc, Basle, Switzerland), 0.01 g of new methylene blue and 0.35 g of N-ethylpyrrolidone at 60° C. so that a clear solution was obtained. Thereafter, cooling to 30° C. was effected, 0.71 g of Desmodur® N3900 (commercial product of Bayer MaterialScience AG, Leverkusen, Germany, hexane diisocyanate-based polyisocyanate, proportion of iminooxadiazinedione at least 30%, NCO content: 23.5%) was added and mixing was effected again. Finally, 0.006 g of Fomrez UL 28 (urethanization catalyst, commercial product of Momentive Performance Chemicals, Wilton, Conn., USA) was added and mixing was effected again briefly. The liquid material obtained was then poured on to a glass plate and covered there with a second glass plate which was kept at a distance of 20 μm by spacers. This test specimen was left to stand for 12 hours at room temperature and cured.

The media 2-13 were prepared in an analogous manner from the examples shown in Table 1. In each case, Table 2 states which example compound was present with which content in the photopolymer formulation. The Δn values determined for the photopolymer formations prepared are likewise summarized in Table 2.

Medium 14:

3.40 g of the polyol component prepared as described above were mixed with 2.00 g of phosphorothioyltris(oxybenzene-4,1-diylcarbamoyloxyethane-2,1-diyl) trisacrylate (urethane acrylate 1), 2.00 g of 2-({[3-(methylsulphanyl)phenyl]carbamoyl}oxy)propyl prop-2-enoate (urethane acrylate 2), 1.50 g of 2,2,2-trifluoroethyl hexylcarbamate (Example 4), 0.10 g of CGI 909 (experimental product of Ciba Inc, Basle, Switzerland), 0.01 g of new methylene blue and 0.35 g of N-ethylpyrrolidone at 60° C. so that a clear solution was obtained. Thereafter, cooling to 30° C. was effected, 0.64 g of N3900 (commercial product of Bayer MaterialScience AG, Leverkusen, Germany, hexane diisocyanate-based polyisocyanate, proportion of iminooxadiazinedione at least 30%, NCO content: 23.5%) was added and mixing was effected again. Finally, 0.006 g of Fomrez UL 28 (urethanization catalyst, commercial product of Momentive Performance Chemicals, Wilton, Conn., USA) was added and mixing was effected again briefly. The liquid material obtained was then poured on to a glass plate and covered there with a second glass plate which was kept at a distance of 20 μm by spacers. This test specimen was left to stand for 12 hours at room temperature and cured.

The media 14-70 were prepared in an analogous manner from the examples shown in Table 1. In each case, Table 3 states which example compound was present with which content in the photopolymer formulation. The Δn values determined for the photopolymer formations prepared are likewise summarized in Table 3.

Comparative Medium I:

8.89 g of the polyol component prepared as described above were mixed with 3.75 g of phosphorothioyltris(oxybenzene-4,1-diylcarbamoyloxyethane-2,1-diyl) trisacrylate (urethane acrylate 1), 0.15 g of CGI 909 (experimental product of Ciba Inc, Basle, Switzerland), 0.015 g of new methylene blue and 0.53 g of N-ethylpyrrolidone were mixed at 60° C. so that a clear solution was obtained. Thereafter, cooling to 30° C. was effected, 1.647 g of Desmodur® N3900 (commercial product of Bayer MaterialScience AG, Leverkusen, Germany, hexane diisocyanate-based polyisocyanate, proportion of iminooxadiazinedione at least 30%, NCO content: 23.5%) were added and mixing was effected again. Finally, 0.009 g of Fomrez UL 28 (urethanization catalyst, commercial product of Momentive Performance Chemicals, Wilton, Conn., USA) was added and mixing was effected again briefly. The liquid material obtained was then poured on to a glass plate and covered there with a second glass plate which was kept at a distance of 20 μm by spacers. This test specimen was left to stand for 12 hours at room temperature and cured.

Comparative Medium II:

3.82 g of the polyol component prepared as described above were mixed with 2.50 g of phosphorothioyltris(oxybenzene-4,1-diylcarbamoyloxyethane-2,1-diyl) trisacrylate (urethane acrylate 1), 2.50 g of propylene carbonate (Comparative Example II), 0.10 g of CGI 909 (experimental product of Ciba Inc, Basle, Switzerland), 0.010 g of new methylene blue and 0.35 g of N-ethylpyrrolidone were mixed at 60° C. so that a clear solution was obtained. Thereafter, cooling to 30° C. was effected, 0.702 g of Desmodur® N3900 (commercial product of Bayer MaterialScience AG, Leverkusen, Germany, hexane diisocyanate-based polyisocyanate, proportion of iminooxadiazinedione at least 30%, NCO content: 23.5%) was added and mixing was effected again. Finally, 0.022 g of Fomrez UL 28 (urethanization catalyst, commercial product of Momentive Performance Chemicals, Wilton, Conn., USA) was added and mixing was effected again briefly. The liquid material obtained was then poured on to a glass plate and covered there with a second glass plate which was kept at a distance of 20 μm by spacers. This test specimen was left to stand for 12 hours at room temperature and cured.

The comparative media III-V were prepared in an analogous manner from the comparative examples shown in Table 2.

Comparative Medium VI:

4.66 g of the polyol component prepared as described above were mixed with 2.00 g of phosphorothioyltris(oxybenzene-4,1-diylcarbamoyloxyethane-2,1-diyl) trisacrylate (urethane acrylate 1), 2.00 g of 2-({[3-(methylsulphanyl)phenyl]carbamoyl}oxy)propyl prop-2-enoate (urethane acrylate 2), 0.10 g of CGI 909 (experimental product of Ciba Inc, Basle, Switzerland), 0.010 g of new methylene blue and 0.35 g of N-ethylpyrrolidone at 60° C. so that a clear solution was obtained. Thereafter, cooling to 30° C. was effected, 0.87 g of Desmodur® N3900 (commercial product of Bayer MaterialScience AG, Leverkusen, Germany, hexane diisocyanate-based polyisocyanate, proportion of iminooxadiazinedione at least 30%, NCO content: 23.5%) was added and mixing was effected again. Finally, 0.006 g of Fomrez UL 28 (urethanization catalyst, commercial product of Momentive Performance Chemicals, Wilton, Conn., USA) was added and mixing was effected again briefly. The liquid material obtained was then poured on to a glass plate and covered there with a second glass plate which was kept at a distance of 20 μm by spacers. This test specimen was left to stand for 12 hours at room temperature and cured.

TABLE 2

Holographic evaluation of selected examples in the formulation with 25% of urethane acrylate 1 and 25% of additive (fluorinated urethane).

| Medium | Example, [% by weight] | Δn |
|---|---|---|
| 1 | 4, 25 | 0.0198 |
| 2 | 2, 25 | 0.0187 |
| 3 | 5, 25 | 0.0235 |
| 4 | 6, 25 | 0.0183 |
| 5 | 9, 25 | 0.0220 |
| 6 | 11, 25 | 0.0210 |
| 7 | 12, 25 | 0.0194 |

TABLE 2-continued

Holographic evaluation of selected examples in the formulation with 25% of urethane acrylate 1 and 25% of additive (fluorinated urethane).

| Medium | | Δn |
|---|---|---|
| 8 | 14, 25 | 0.0223 |
| 9 | 15, 25 | 0.0150 |
| 10 | 19, 25 | 0.0173 |
| 11 | 20, 25 | 0.0249 |
| 12 | 21, 25 | 0.0257 |
| 13 | 214, 25 | 0.0152 |
| Comparative examples, [% by weight] | | |
| I | No additive | 0.0115 |
| II | Propylene carbonate, 25 | 0.0136 |
| III | Dimethyl adipate, 25 | 0.0146 |
| IV | Diethylene glycol diacetate, 25 | 0.0146 |
| V | Triethyl citrate, 25 | 0.0115 |

The values described for Δn were achieved at doses of 4-32 ml/cm².

The values found for the holographic property Δn of the holographic media show that the commercial additives used in the comparative medium is less suitable for use in holographic media, whereas the urethanes according to the invention are very suitable in the media 1 to 13 for the preparation of holographic media, owing to the higher value for Δn.

TABLE 3

Holographic evaluation of selected examples in the formulation with 20% by weight of urethane acrylate 1, 20% by weight of urethane acrylate 2 and 15% by weight of additive (fluorinated urethane).

| Medium | Example, [% by weight] | Δn |
|---|---|---|
| 14 | 2, 15 | 0.0253 |
| 15 | 4, 15 | 0.0238 |
| 16 | 5, 15 | 0.0302 |
| 17 | 7, 15 | 0.0305 |
| 18 | 8, 15 | 0.0220 |
| 19 | 14, 15 | 0.0284 |
| 20 | 15, 15 | 0.0205 |
| 21 | 19, 15 | 0.0235 |
| 22 | 20, 15 | 0.0310 |
| 23 | 21, 15 | 0.0330 |
| 24 | 26, 15 | 0.0365 |
| 25 | 32, 15 | 0.0348 |
| 26 | 35, 15 | 0.0295 |
| 27 | 36, 15 | 0.0217 |
| 28 | 46, 15 | 0.0261 |
| 29 | 48, 15 | 0.0261 |
| 30 | 51, 15 | 0.0230 |
| 31 | 52, 15 | 0.0310 |
| 32 | 54, 15 | 0.0310 |
| 33 | 55, 15 | 0.0245 |
| 34 | 66, 15 | 0.0250 |
| 35 | 67, 15 | 0.0260 |
| 36 | 68, 15 | 0.0250 |
| 37 | 71, 15 | 0.0230 |
| 38 | 72, 15 | 0.0234 |
| 39 | 73, 15 | 0.0240 |
| 40 | 74, 15 | 0.0260 |
| 41 | 75, 15 | 0.0225 |
| 42 | 76, 15 | 0.0204 |
| 43 | 82, 15 | 0.0239 |
| 44 | 84, 15 | 0.0203 |
| 45 | 132, 15 | 0.0286 |
| 46 | 133, 15 | 0.0283 |
| 47 | 141, 15 | 0.0239 |
| 48 | 146, 15 | 0.0210 |
| 49 | 147, 15 | 0.0272 |
| 50 | 164, 15 | 0.0220 |

TABLE 3-continued

Holographic evaluation of selected examples in the formulation with 20% by weight of urethane acrylate 1, 20% by weight of urethane acrylate 2 and 15% by weight of additive (fluorinated urethane).

| Medium | | Δn |
|---|---|---|
| 51 | 165, 15 | 0.0229 |
| 52 | 166, 15 | 0.0209 |
| 53 | 170, 15 | 0.0235 |
| 54 | 172, 15 | 0.0245 |
| 55 | 174, 15 | 0.0202 |
| 56 | 175, 15 | 0.0201 |
| 57 | 180, 15 | 0.0230 |
| 58 | 181, 15 | 0.0235 |
| 59 | 182, 15 | 0.0255 |
| 60 | 183, 15 | 0.0248 |
| 61 | 184, 15 | 0.0233 |
| 62 | 192, 15 | 0.0261 |
| 63 | 198, 15 | 0.0269 |
| 64 | 201, 15 | 0.0210 |
| 65 | 202, 15 | 0.0262 |
| 66 | 203, 15 | 0.0305 |
| 67 | 220, 15 | 0.0229 |
| 68 | 221, 15 | 0.0279 |
| 69 | 222, 15 | 0.0221 |
| 70 | 223, 15 | 0.0303 |
| Comparative example | | |
| VI | No additive | 0.0140 |

The values described for Δn were achieved at doses of 4-32 mJ/cm².

The values found for the holographic property Δn of the holographic media show that fluorinated urethanes according to the invention are very suitable in the media 14 to 70 for the preparation of holographic media, owing to the high values for Δn.

The invention claimed is:

1. A photopolymer formulation comprising matrix polymers, writing monomers and photoinitiators, wherein the photopolymer formulation further comprises fluorourethanes as plasticizers, wherein the matrix polymers comprise polyurethanes and wherein the photopolymer formulation consists essentially of 15 to 79% by weight of matrix polymers, 5 to 50% by weight of acrylate writing monomers having a refractive index of $n_d^{20} > 1.50$, 1 to 10% by weight of photoinitiators, between 5 and 40% by weight of fluorourethanes and 0 to 10% by weight of further additives, wherein the sum of the constituents being 100% by weight.

2. The photopolymer formulation according to claim 1, wherein the fluorourethanes comprise compounds having the formula (II)

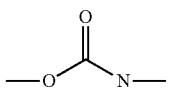

(I)

wherein n is from 1 to 8 and $R^1$, $R^2$, $R^3$ represent, independently of one another, hydrogen or linear, branched, cyclic or heterocyclic organic radicals which are unsubstituted or optionally also substituted by heteroatoms, at least one of the radicals $R^1$, $R^2$, $R^3$ being substituted by at least one fluorine atom.

3. The photopolymer formulation according to claim 2, wherein $R^1$ represents an organic radical having at least one fluorine atom.

4. The photopolymer formulation according to claim 2, wherein $R^1$ comprises 1-20 $CF_2$ groups and/or one or more $CF_3$ groups, $R^2$ comprises a C1-C20 alkyl radical or hydrogen, and $R^3$ comprises a C1-C20 alkyl radical or hydrogen.

5. The photopolymer formulation according to claim 2, wherein $R^1$ comprises 1-10 $CF_2$ groups and/or one or more $CF_3$ groups, $R^2$ comprises a C1-C10 alkyl radical or hydrogen, and $R^3$ comprises a C1-C10 alkyl radical or hydrogen.

6. The photopolymer formulation according to claim 2, wherein $R^1$ comprises 1-8 $CF_2$ groups and/or one or more $CF_3$ groups.

7. The photopolymer formulation according to claim 1, wherein the fluorourethanes comprise uretdione, isocyanurate, biuret, allophanate, polyurea, oxadiazadione and/or iminooxadiazinedione structural elements and/or mixtures of these structural elements.

8. The photopolymer formulation according to claim 1, wherein the fluorourethanes have a refractive index $n^2_D$ of ≤1.4600.

9. The photopolymer formulation according to claim 1, wherein the fluorourethanes have a refractive index $n^{20}_D$ of ≤1.4300.

10. The photopolymer formulation according to claim 1, wherein the fluorourethanes have a fluorine content of 10-80% by weight.

11. The photopolymer formulation according to claim 1, wherein the fluorourethanes have a fluorine content of 17.5-65% by weight.

12. Holographic elements and images formed from the photopolymer formulation according to claim 1.

13. A method for exposing holographic media comprising the photopolymer formulation according to claim 1, wherein the method comprises selectively polymerizing the writing monomers with spatial resolution by electromagnetic radiation.

* * * * *